United States Patent
Hall et al.

(10) Patent No.: US 11,876,621 B2
(45) Date of Patent: *Jan. 16, 2024

(54) FORWARD ERROR CORRECTION FOR CHIRP SPREAD SPECTRUM

(71) Applicant: Sure-Fi Inc., Provo, UT (US)

(72) Inventors: Mark Hall, Smithfield, UT (US); David R. Hall, Provo, UT (US); Warren Willes, Alpine, UT (US); John Robinson, Spanish Fork, UT (US)

(73) Assignee: Sure-Fi, Inc., Provo, UT (US)

( * ) Notice: Subject to any disclaimer, the term of this patent is extended or adjusted under 35 U.S.C. 154(b) by 3 days.

This patent is subject to a terminal disclaimer.

(21) Appl. No.: 17/470,169

(22) Filed: Sep. 9, 2021

(65) Prior Publication Data

US 2022/0209890 A1    Jun. 30, 2022

Related U.S. Application Data

(60) Provisional application No. 63/132,999, filed on Dec. 31, 2020.

(51) Int. Cl.
| | |
|---|---|
| *G11C 29/00* | (2006.01) |
| *H04L 1/00* | (2006.01) |
| *H03M 13/00* | (2006.01) |
| *H03M 13/25* | (2006.01) |
| *H04B 1/69* | (2011.01) |

(52) U.S. Cl.
CPC ........ *H04L 1/0042* (2013.01); *H03M 13/258* (2013.01); *H03M 13/616* (2013.01); *H04B 1/69* (2013.01); *H04B 2001/6912* (2013.01)

(58) Field of Classification Search
CPC ...... H04L 1/0042; H04L 1/69; H03M 13/616; H03M 13/258; H04B 2002/6912
See application file for complete search history.

(56) References Cited

U.S. PATENT DOCUMENTS

2022/0209815 A1 * 6/2022 Hall ................. H04L 1/0066
2022/0209892 A1 * 6/2022 Hall ................. H03M 13/2909

* cited by examiner

*Primary Examiner* — Samir W Rizk

(57) ABSTRACT

Devices and methods for enhancing forward error correction techniques for communications using chirp spread spectrum are disclosed. Systems, devices, and methods for error correction coding and decoding are described. On the coding side, K bits of data are sequentially loaded into an M bit by N bit (M×N) matrix in a first direction as Q sequences of D bits, each D bit row of data in the M×N matrix is coded with an error correction code to generate an M bit row of coded data, each Q bit column in the M×N matrix is coded with the error correction code to generate N bits of coded data, N sequences of M bits are sequentially unloaded from the M×N matrix in a second direction, and a chirp signal is generated having a plurality of chirps.

20 Claims, 11 Drawing Sheets

FORWARD ERROR CORRECTION FOR CHIRP SPREAD SPECTRUM

CROSS-REFERENCE TO RELATED APPLICATIONS

The present application for patent claims priority to U.S. Provisional Application No. 63/132,999, filed Dec. 31, 2020, which is assigned to the assignee of the present application and hereby expressly incorporated by reference

TECHNICAL FIELD

The described systems and methods are directed to wireless communication using chirp signals. In particular, the described systems and methods are directed to forward error correction for communications over a wireless channel using chirp spread spectrum.

BACKGROUND

Different radio access technologies have different advantages and disadvantages. For example, some radio access technologies are particularly suited for short range communications (e.g., 0 to 100 meters (m)), such as Bluetooth, while other radio access technologies are particularly suited for medium range communications (e.g., 100 m to 20 kilometers (km)), such as cellular technologies (e.g., 3G, 4G, LTE, 5G NR), and yet other radio access technologies (e.g., chirp-based radio access technologies) are particularly suited for long range communications (e.g., 1 km to 100 km), such as chirp spread spectrum, LoRaWAN, and the like (which utilize the 900 Megahertz (MHz) frequency band, for example).

Wireless channels are typically noisy, which can interfere with wireless communications. The challenges associated with a noisy channel can mitigated in a variety of ways, including increasing transmit power, improving receive signal strength, and through error correction techniques. Each of these approaches comes with a unique set of benefits and drawbacks. For example, increasing an error correction coding rate reduces data. Accordingly, there is a need to optimize the use of these different approaches. In particular there is a need to optimize the way a noisy channel can be mitigated for more efficient chirp-based communications.

SUMMARY

In a first aspect, a method for error correction coding is described. The method includes obtaining K bits of data, loading the K bits of data sequentially into an M bit by N bit (M×N) matrix in a first direction as Q sequences of D bits, coding each D bit row of data in the M×N matrix with an error correction code to generate an M bit row of coded data, wherein each M bit row of coded data corresponds to a first codeword having M-D bits of parity, coding each Q bit column in the M×N matrix with the error correction code to generate N bits of coded data, wherein each N bit column corresponds to a second codeword, and wherein D of the N bit columns comprise coded data and M-D of the N bit columns comprise coded parity including N-Q parity on parity bits, unloading N sequences of M bits sequentially from the M×N matrix in a second direction, generating a chirp signal having a plurality of chirps, wherein each chirp corresponds to one of the sequences of M bits, and transmitting the generated chirp signal. In addition, methods for decoding and are also described.

In a second aspect, the disclosure provides that the error correction code comprises a Hamming code.

In a third aspect, the disclosure provides that the error correction code comprises a turbo code.

In a fourth aspect, the disclosure provides that the M×N matrix comprises a D bit by Q bit (D×Q) matrix of data with the remaining portion of the M×N matrix filled with parity bits, including a P bit by P bit (P×P) matrix of the parity on parity bits.

In a fifth aspect, the disclosure provides that the error correction code comprises a Hamming(31/26) code, where D is 26, Q is 26, P is 5, M is 31, and N is 31.

In a sixth aspect, the disclosure provides that the error correction code comprises an extended Hamming(31/26) code with an additional parity bit on the 31 bit sequence, where D is 26, Q is 26, P is 6, M is 32, and N is 32.

In a seventh aspect, the disclosure provides that the chirp signal is generated based on a chirp bandwidth and spreading factor.

In an eighth aspect, the disclosure provides that the first direction is by row and the second direction is by column.

In a ninth aspect, the disclosure provides that the first direction is by row and the second direction is diagonally.

In a tenth aspect, a method for error correction decoding in wireless communication is described. The method includes receiving a chirp signal having a plurality of chirps, wherein each chirp corresponds to a sequence of M bits, and wherein the plurality of chirps correspond to N sequences of M bits, loading the N sequences of M bits into an M bit by N bit (M×N) matrix in a first direction, wherein the (M×N) matrix comprises P parity on parity bits, wherein each M bit row corresponds to a first codeword, and wherein each N bit column corresponds to a second codeword, decoding each N bit column within the M×N matrix based on an error correction code and N-Q parity bits, wherein M-D of the N bit columns are parity columns and the N-Q parity bits are parity on parity bits, wherein decoding each N bit column comprises correcting any correctable bit errors within Q bits in the N bit column based on the error correction code and the N-Q parity bits, decoding each M bit row within the M×N matrix based on the error correction code and M-D parity bits, wherein decoding each M bit row comprises correcting any correctable bit errors within D bits of data in the M bit row based on the error correction code and the M-D parity bits, and unloading K bits of data sequentially from the M×N matrix in a second direction, wherein the K bits of data are unloaded from Q sequences of D bits.

In an eleventh aspect, the disclosure provides that the error correction code comprises a Hamming code.

In a twelfth aspect, the disclosure provides that the error correction code comprises a turbo code.

In a thirteenth aspect, the disclosure provides that coding each row of D bits in the M×N matrix with an error correction code forms D columns of the Q data bits and M-D columns of the Q parity bits.

In a fourteenth aspect, the disclosure provides that the M×N matrix comprises a D bit by Q bit (D×Q) matrix of data with the remaining portion of the M×N matrix filled with parity bits, including a P bit by P bit (P×P) matrix of the parity on parity bits.

In a fifteenth aspect, the disclosure provides that the error correction code comprises a Hamming(31/26) code, where D is 26, Q is 26, P is 5, M is 31, and N is 31.

In a sixteenth aspect, the disclosure provides that the error correction code comprises an extended Hamming(31/26) code with an additional parity bit on the 31 bit sequence, where D is 26, Q is 26, P is 6, M is 32, and N is 32.

In a seventeenth aspect, the disclosure provides that the chirp signal is received based on a chirp bandwidth and spreading factor.

In an eighteenth aspect, the disclosure provides that the method further includes demodulating the chirp signal to obtain the MN bits, wherein each M bit sequence is modulated as one of the plurality of chirps.

In a nineteenth aspect, the disclosure provides that the first direction is by column and the second direction is by row.

In a twentieth aspect, the disclosure provides that the first direction is diagonally and the second direction is by row.

In a twenty first aspect, a method for error correction coding is disclosed. The method includes: obtaining $N^2$ bits of transmission data, coding the $N^2$ bits of transmission data using a correction code to generate N coded sequences, the correction code coding N bits of transmission data into a coded sequence having K bits with N data bits followed by P parity bits, generating a K bit by N bit (K×N) matrix by sequentially allocating the N coded sequences as rows in the K×N matrix, coding each column of the K×N matrix using the correction code to generate K coded sequences, the correction code coding a column of N bits into a coded sequence having K bits with the column of N bits followed by P parity bits, wherein applying the correction code to each of the P columns of parity bits generate P bits of parity on parity, and adding the P bits of parity from each of the K coded sequences to the K×N matrix to generate a K×K matrix, wherein the K×K matrix comprises $K^2$ bits of coded transmission data.

In a twenty second aspect, the disclosure provides that the $K^2$ bits of coded transmission data comprise an entire message payload.

In a twenty third aspect, the disclosure provides that the K×K matrix comprises a N×N matrix of transmission data with the remaining portion of the K×K matrix filled with parity bits, including a P×P matrix of the parity on parity.

In a twenty fourth aspect, the disclosure provides that the method further includes transmitting the $K^2$ bits of coded transmission data using a chirp signal having a sequence of chirps that are modulated using a spreading factor and a chirp bandwidth.

In a twenty fifth aspect, the disclosure provides that the correction code comprises a Hamming code.

In a twenty sixth aspect, the disclosure provides that the correction code comprises a Hamming(31/26) code, where N is 26, P is 5, and K is 31.

In a twenty seventh aspect, the disclosure provides that the correction code comprises an extended Hamming(31/26) code with an additional parity bit on the 31 bit sequence, where N is 26, P is 6, and K is 32, wherein the additional parity bit provides single error correction, double error detection (SECDEC).

In a twenty eighth aspect, the disclosure provides that the parity on parity provides double error correction, double error detection (DECDEC).

In a twenty ninth aspect, the disclosure provides that each of the frequency channels in each table of frequency channels is orthogonal.

In a thirtieth aspect, the disclosure provides that the table of frequency channels associated with each of the spreading factors is orthogonal, and wherein each table of frequency channels includes 72 frequency channels.

In a thirty first aspect, the disclosure provides that the spreading factor and the chirp bandwidth are selected in combination to achieve a data throughput of at least 300 bits per second (bps).

Further aspects and embodiments are provided in the foregoing drawings, detailed description, and claims.

BRIEF DESCRIPTION OF THE DRAWINGS

The following drawings are provided to illustrate certain embodiments described herein. The drawings are merely illustrative and are not intended to limit the scope of claimed inventions and are not intended to show every potential feature or embodiment of the claimed inventions. The drawings are not necessarily drawn to scale; in some instances, certain elements of the drawing may be enlarged with respect to other elements of the drawing for purposes of illustration.

DETAILED DESCRIPTION

Figure 1:
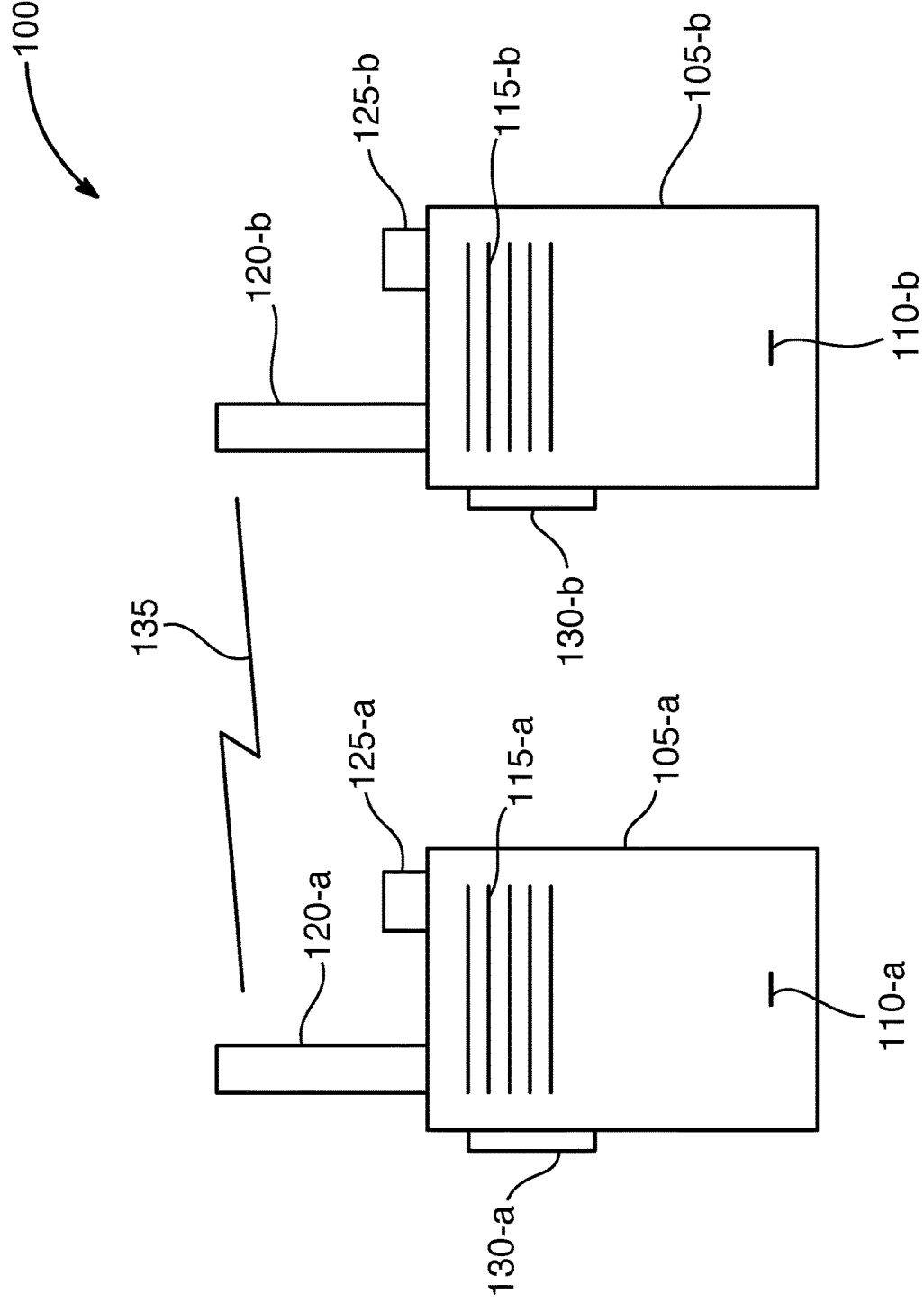
FIG. 1 illustrates an exemplary environment in which the described systems, methods, and devices may be implemented.

The following description recites various aspects and embodiments of the inventions disclosed herein. No particular embodiment is intended to define the scope of the invention. Rather, the embodiments provide non-limiting examples of various compositions, and methods that are included within the scope of the claimed inventions. The description is to be read from the perspective of one of ordinary skill in the art. Therefore, information that is well known to the ordinarily skilled artisan is not necessarily included.

The following terms and phrases have the meanings indicated below, unless otherwise provided herein. This disclosure may employ other terms and phrases not expressly defined herein. Such other terms and phrases shall have the meanings that they would possess within the context of this disclosure to those of ordinary skill in the art. In some instances, a term or phrase may be defined in the singular or plural. In such instances, it is understood that any term in the singular may include its plural counterpart and vice versa, unless expressly indicated to the contrary.

As used herein, the singular forms "a," "an," and "the" include plural referents unless the context clearly dictates otherwise. For example, reference to "a substituent" encompasses a single substituent as well as two or more substituents, and the like.

As used herein, "for example," "for instance," "such as," or "including" are meant to introduce examples that further clarify more general subject matter. Unless otherwise expressly indicated, such examples are provided only as an aid for understanding embodiments illustrated in the present disclosure and are not meant to be limiting in any fashion. Nor do these phrases indicate any kind of preference for the disclosed embodiment.

Bandwidth can be defined as the amount of data that can be communicated in a given time using a given frequency range. Because the frequency of a signal directly impacts the amount of data that can be communicated across the waveform, frequency of the signal becomes the primary determinant of bandwidth of the signal. Because different frequencies have different propagation properties, the choice of frequency also directly impacts the range of the signal. Thus, frequency impacts both bandwidth and range, with progressively lower frequencies generally providing progressively lower bandwidths but progressively longer ranges and with progressively higher frequencies generally providing progressively higher bandwidths but progressively lower ranges. Accordingly, there is typically a tradeoff between range and bandwidth.

Thus, one of the challenges associated with long range wireless communication systems is low data rates (e.g., bandwidth limitations). The bandwidth limitations associated with long range frequency ranges typically limits the types of data that can be communicated using the long-range frequency ranges. For example, voice communication is typically not available using long range frequency ranges due to the bandwidth limitations of long-range frequency ranges.

It is appreciated that the bandwidth limitations associated with long range frequency ranges (e.g., 900 MHz) exist before error correction is applied. Accordingly, the addition of error correction coding, which adds overhead for parity, further limits actual data rates (e.g., bandwidth for data) to an already bandwidth limited system. As noted above, wireless channels are often noisy. Therefore, it is often necessary to implement forward error correction to achieve reliable, long distance communication.

The present systems, methods, and devices optimize the use of forward error correction for chirp-based communication over low bandwidth, long range frequency ranges (e.g., the sub-1 gigahertz (GHz) industrial, scientific, and medical (ISM) radio bands, such as the 902-928 megahertz (MHz) frequency band). As described herein, the present systems, methods, and devices maximize the benefit of a given forward error correction coding rate through advanced error correction processing algorithms. It is appreciated that the described systems, methods, and devices are optimized for chirp-based communication schemes (e.g., chirp spread spectrum, chirp division multiplexing) over low bandwidth, long range frequency bands. Due to the nature of chirp-based communication, both in terms of bandwidth and timing, the described systems, methods, and devices may be implemented in real time.

Referring now to the figures, FIG. 1 illustrates an exemplary environment 100 in which the described systems, methods, and devices may be implemented. The exemplary environment 100 includes a pair of wireless communication devices 105-a, 105-b (e.g., handheld radios 105-a, 105-b) that are communicatively connected via wireless communication link 135.

Wireless communication devices 105-a, 105-b (e.g., handheld radios 105-a, 105-b) may be any type of wireless communication device. For example, a wireless communication device 105 may be a handheld radio 105-a, 105-b (as illustrated in FIG. 1, for example), a walkie-talkie, a mobile device, a cell phone, a tablet, a laptop computer, a base station, or a stand-alone bridge device. A wireless communication device 105 (referred to, with regard to FIG. 1, as handheld device 105-a, 105-b) includes a wireless radio for communicating over the wireless communication link 135. As illustrated, a handheld device 105-a, 105-b may include a microphone 110-a, 110-b, a speaker 115-a, 115-b, an antenna 120-a, 120-b, a volume selector 125-a, 125-b, and a push-to-talk button 130-a, 130-b. Although not shown, a handheld device 105-a, 105-b may include a processor and memory that enables the function of the handheld device 105-a, 105-b, including, for example the function of the wireless radio.

In one example, the first handheld radio 105-a may receive voice input via the microphone 110-a. For instance, a first user may depress the push-to-talk button 130-a (to enable the microphone 110-a, for example) and may speak into the microphone 110-a to produce the voice information. The first handheld radio 105-a may code (using linear predictive coding, for example) the voice information received via the microphone 110-a to a digital data stream, may code the digital data stream with a forward error correction code to generate a coded data stream. For example, the forward error correction code may be an extended Hamming code (e.g., Hamming(32,26)) that enables single error correction and dual error detection (SECDED). The first handheld radio 105 may generate a transmission signal using chirp division multiplexing for transmitting the coded data stream. The antenna 120-a may transmit the transmission signal over the wireless communication link 135 via the antenna 120-a.

The second handheld radio 105-b may receive a reception signal (e.g., the transmission signal plus noise and/or interference) from the wireless communication link 135 via the antenna 120-b. The second handheld radio 105-b may decode the coded data stream based on the error correction code (e.g., Hamming(32,26)) to obtain a digital data stream. Because an extended Hamming code enables SECDED, in the error correction decoding process, correctable bit errors (e.g., single bit errors) may be corrected and uncorrectable bit errors (e.g., double bit errors) may be detected. The decoded data stream (e.g., digital data stream) may be decoded (using a linear predictive decoder, for example) to obtain the received voice information. The second handheld radio 105-b may synthesize the received voice information for playback over the speaker 115-b. It is appreciated that the error correction coding and error correction decoding may enable the data stream to be recovered from the received reception signal despite (correctable) bit errors due to the added noise and/or interference.

In this example, the volume of the speaker 115-b may be selected via the volume selector 125-b and the speaker 115-b may play the synthesized voice information. For instance, the synthesized voice information may be played via the speaker 115-b so that a second user may physically hear the synthesized voice information (e.g., the speech from the first user). The second user may respond back to the first user using the same procedure discussed with respect to the first user.

Although FIG. 1 illustrates handheld radios 105, which perform all of the described functions in a single device, it is appreciated that the described functions may be spread across multiple devices. For example, the voice capture and voice coding may occur at a mobile device (e.g., a cell phone or tablet) and transmitted to a bridge device (via Bluetooth, for example) which performs the forward error correction coding and chirp division multiplexing. The bridge device may transmit the chirp signal (conveying the parameters of the vocal model, for example) to a second bridge device that performs the receive side chirp division (de)multiplexing and forward error correction decoding. The second bridge device may transmit the coded voice data to a second mobile device, which performs the voice decoding and voice syntheses. These embodiments are described more fully in U.S. patent application Ser. No. 16/360,760 entitled "BRIDGE FOR WIRELESS COMMUNICATION" which is incorporated by reference herein in its entirety. It is apparent that different configurations, including a bridge device to a handheld device 105 and vice versa are also possibilities.

Figure 2:
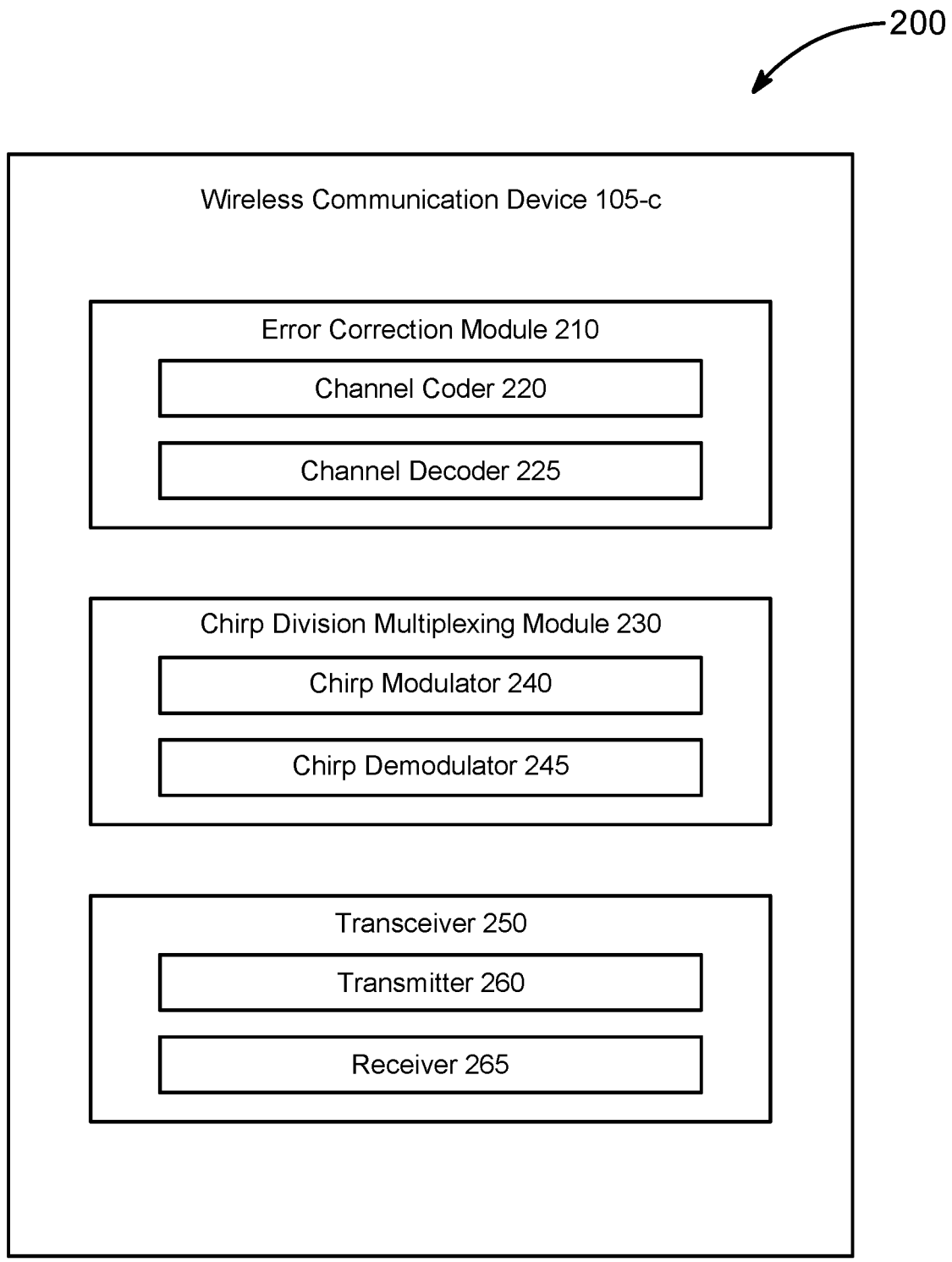
FIG. 2 is a block diagram illustrating one example of a wireless communication device.

FIG. 2 is a block diagram illustrating one example of a wireless communication device 105-c. Wireless communication device 105-c is an example of the wireless communication devices 105-a, 105-b illustrated with respect to FIG. 1. The wireless communication device 105-c includes an error correction module 210, a chirp division multiplexing module 230, and transceiver 250.

In some embodiments, all data packet transmissions may include Forward Error Correction (FEC) (via the channel coder 220, for example). FEC is a digital signal processing technique used to enhance data reliability over an unreliable or noisy communications channel by adding redundancy to the data, via an error correcting code (e.g., parity). This allows the receiver (e.g., channel decoder 240) to detect and correct a certain number of errors without the need for retransmission of the message.

The error correction module 210 includes a channel coder 220 and a channel decoder 225. The channel coder 220 encodes a data stream with an error correction code to generate a coded data stream. The error correction module 210 may add one or more parity bits to the data, which adds redundancy and enable certain bit error correction based on the error correction code used. Examples of error correction codes include block codes (e.g., Hamming codes, Reed Solomon codes, Golay codes, Bose-Chaudhuri-Hocquenghem (BCH) codes, Multidimensional parity codes) and convolution codes (e.g., Viterbi codes, BCJR codes, turbo codes, low density parity-check (LDPC) codes). In addition, the error correction module 210 may implement iterative codes (e.g., a concatenation of two or more error correction codes).

Figure 3:
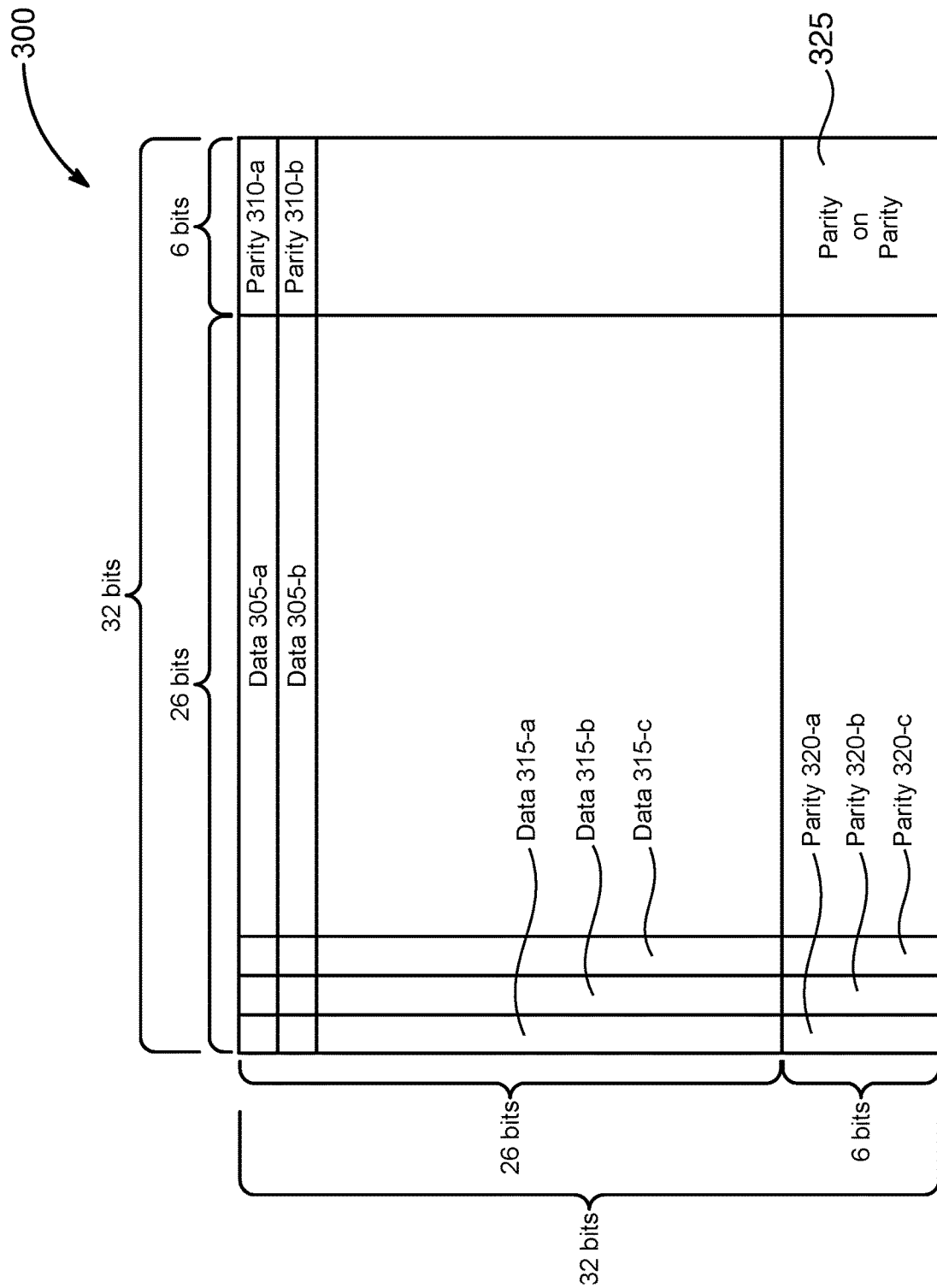
FIG. 3 is a block diagram illustrating an error correction table.

The channel coder 220 breaks a data stream into fixed length segments and codes the fixed length segments with an error correction coding scheme (e.g., forward error correction (FEC)). As described herein, the channel coder 220 breaks the stream into fixed length segments and loads the fixed length segments into a table (as illustrated in FIG. 3, for example) for coding. As will be discussed hereafter, the coding is performed on the data/information in the table following insertion into the table. Following coding, channel coder 220 pulls (e.g., unloads) the data from the table (and passes it to the chirp division multiplexing module 230, for example).

Data may be loaded into the table the same way (e.g., by row, by column, diagonally, etc.) that the coded data is unloaded from the table. For example, the data may be loaded into the table by row and the coded data may be unloaded from the table by row. Alternatively, data may be loaded into the table in a different way than the coded data is unloaded from the table. For example, the data may be loaded into the table diagonally and the coded data may be unloaded from the table by row. It is appreciated that loading the data into the table in a first direction and unloading the coded data from the table in a second direction that is different than the first direction may facilitate an interleaving function that interleaves the data so as to mitigate burst error interference. In other words, the channel coder 220 may perform data interleaving via the data loading/coded data unloading from the table to enhance the performance of the wireless communication.

Interleaving may be used to correct burst errors. In some embodiments, the combination of interleaving and forward error correction is capable of correcting eight (8) consecutive bits of a burst error for every 8 bytes, which represents between 1.5% and 12.5% of potential bit error rates (BERs) on the data link depending on the distribution of errors.

Data interleaving randomizes the FEC coding, by changing the ordering in which the blocks of coded data are sent so that consequences of burst errors during transmission are minimized. Data interleaving is a cleaver technique whereby the ability to correct for one or more bits errors per word is improved to many bit errors, for burst protection, simply by the way in which the data is ordered for over-the-air transmission. This ordering may be set in how the data is loaded and/or how the coded data is unloaded from the table. For example, loading the data into the table diagonally and unloading from the table by row (or column) facilitates a diagonal interleaving. Table 1 provides an example of how data may be loaded into a table and unloaded from the table to enable diagonal interleaving. The example set forth in Table 1 assumes a table that is coded using an extended Hamming (8,4) error correction code.

As is shown in Table 1, Sxx refers to data and Pxx refers to parity. On the transmission side, the data bits are assembled (e.g., loaded) sequentially into the table for transmission by row in columns 1 through 12. With the data bits (e.g., S00-S41) loaded into the Table 1, the channel coder 220 encodes the data by column (e.g., column by column, adding 4 total parity bits per column, for example) using an Extended Hamming (8,4) error correction code. As a result of the encoding, parity bits (e.g., P00-P41) are added to Table 1. The interleaving occurs as the coded data bits are pulled from the table for transmission because the coded data bits are pulled from the table for transmission in a diagonal fashion as indicated by color in Table 1 which reorders the coded data bits and thus randomizes the error correction coding. For example, all the purples may be pulled first, followed by all of the oranges, followed by all of the greens, and so forth.

Similarly, on the reception side, the channel decoder 225 receives the coded data bits and loads the coded data bits into a corresponding reception table in a diagonal fashion as indicated by color in Table 1 (complimentary to the way the channel coder 220 unloaded the coded data from the transmission table, for example). With the reception table repopulated in the diagonal fashion as indicated by color, the channel decoder 225 decodes the coded data by column, correcting any correctable bit errors in the data. With the now decoded data bits (e.g., data bits) decoded, the channel decoder 225 disassembles (e.g., unloads) the data bits in columns 1 through 12 by row (complementary to the way the channel coder 220 loaded the data bits into the transmission table, for example), which results in a complete transformation from an ordered stream of data bits to a diagonally ordered (e.g., randomized/interleaved) stream of coded data for over the air transmission and reception as a diagonally ordered stream of coded data bits and back to the ordered stream of data bits for unloading from the reception table by row.

It is appreciated that each column of 8 bits is correctable for a single error. With this technique of diagonal interleaving combined with Hamming (8,4), if any whole color is corrupted, representing an over-the-air burst of noise, all 12 columns could still be recovered with a series of single bit error corrections. It is appreciated that for varying packet sizes, the Table 1 may be extrapolated to show 8 bits of burst error correction for every multiple of 8 bytes transmitted.

and process gain. Code gain is the gain that is achieved out of coding rate by being able to correct bits (using forward error correct (FEC), as described herein, for example). Code gain has the trade-off of the efficiency of the coding scheme that is being used and the consequences that brings (e.g., delays, coding schemes have efficiencies less than 1, with the higher the code rates resulting in lower efficiencies, for example). Process gain on the other hand is achieved through processing techniques, such as spread spectrum and interleaving. Code gain can be increased in chirp-based communication because chirp is low bit rate, which gives

TABLE 1

| 1 | 2 | 3 | 4 | 5 | 6 | 7 | 8 | 9 | 10 | 11 | 12 |
|---|---|---|---|---|---|---|---|---|---|---|---|
| S00 | S01 | S02 | S03 | S04 | S05 | S06 | S07 | S08 | S09 | S10 | S11 |
| Purple | Orange | Green | Blue | Yellow | Gray | Cyan | Red | Gold | Pink | Navy | White |
| S10 | S11 | S12 | S13 | S14 | S15 | S16 | S17 | S18 | S19 | S20 | S21 |
| White | Purple | Orange | Green | Blue | Yellow | Gray | Cyan | Red | Gold | Pink | Navy |
| S20 | S21 | S22 | S23 | S24 | S25 | S26 | S27 | S28 | S29 | S30 | S31 |
| Navy | White | Purple | Orange | Green | Blue | Yellow | Gray | Cyan | Red | Gold | Pink |
| S30 | S31 | S32 | S33 | S34 | S35 | S36 | S37 | S38 | S39 | S40 | S41 |
| Pink | Navy | White | Purple | Orange | Green | Blue | Yellow | Gray | Cyan | Red | Gold |
| P00 | P01 | P02 | P03 | P04 | P05 | P06 | P07 | P08 | P09 | P10 | P11 |
| Gold | Pink | Navy | White | Purple | Orange | Green | Blue | Yellow | Gray | Cyan | Red |
| P10 | P11 | P12 | P13 | P14 | P15 | P16 | P17 | P18 | P19 | P20 | P21 |
| Red | Gold | Pink | Navy | White | Purple | Orange | Green | Blue | Yellow | Gray | Cyan |
| P20 | P21 | P22 | P23 | P24 | P25 | P26 | P27 | P28 | P29 | P30 | P31 |
| Cyan | Red | Gold | Pink | Navy | White | Purple | Orange | Green | Blue | Yellow | Gray |
| P30 | P31 | P32 | P33 | P34 | P35 | P36 | P37 | P38 | P39 | P40 | P41 |
| Gray | Cyan | Red | Gold | Pink | Navy | White | Purple | Orange | Green | Blue | Yellow |

In some embodiments, the channel coder 220 may incorporate security features such as encryption. For example, the channel coder 220 may incorporate an Advanced Encryption Standard (AES) 128 cryptographic algorithm for all over-the-air data packets (prior to channel coding or following channel coding, for example). In some cases, the AES 128 cryptographic algorithm may include a proprietary over-the-air rekeying process for key distribution and other information obscuring techniques.

The channel coder 220 may encode a data stream with an error correction code, such as a Hamming code (e.g., Hamming(7,4), Hamming(15,11), Hamming(31,26), and the like) or an extended Hamming code (e.g., Hamming(8,4), Hamming(16,11), Hamming(32,26), and the like). It is appreciated that Hamming codes provide single error correction (SEC) and extended Hamming codes (that includes an additional parity bit on the overall Hamming code, for example) provides single error correction dual error detection (SECDED). Although the foregoing suggests using Hamming codes for FEC, it is appreciated that any of a number of alternative FEC may be used without departing from the scope of the described systems, devices, and methods, including, for example, Reed-Solomon, Golay, multidimensional parity, Viterbi, turbo codes, turbo product codes (TPC), and the like. As discussed herein, FEC, and particularly error detection and error correction help ensure reliable communication between the transmitter and the receiver.

With low data rate connections (e.g., long range frequencies (e.g., 902 MHz-928 MHz frequency band) using chirp spread spectrum, for example) optimizing data throughput while maintaining data integrity is a constant challenge. It is appreciated that there is a trade-off between delay and block size and code rate (e.g., a trade-off between channel noise/error correction efficiency (code rate)/block size). In general, there are two types of gains that can be achieved, code gain time for additional computational processing to be performed in real time. Error correction, however, further reduces bit rate (e.g., efficiency) on an already low bit rate system, so it is important to optimize error correction performance.

In some embodiments, the size of the resulting coded segment (e.g., coded data from the channel coder 220) may be matched to align with the size of the codes (e.g., bit length) in the codebook used by the chirp modulator 240 (e.g., in a 1:1 relationship) to optimize performance between the coding scheme and the modulation scheme. For example, the length of the fixed length segment is based on the coding rate of the channel coder 220 and the length of the codewords used by the chirp modulator 240. For example, with the chirp modulator 240 using 32 bit codewords, the stream of data bits may be segmented into segments of 26 data bits, which may be encoded with 5+1 parity bits (using extended Hamming(32/26), for example) to generate a coded segment that is 32 bits long (81.25% throughput, for example) to provide a one-to-one mapping between the length of a segment of coded and a length of the codewords used by the chirp modulator 240. The resulting coded segment is provided to the chirp modulator 240.

The channel decoder 225 takes a coded data segment (e.g., corresponding to a unique chirp symbol, chirp codeword) and decodes the coded segment using the selected coding scheme by performing the complimentary function of the channel coder 220. As noted above, the channel decoder 225 loads the received coded data into a reception table in the same manner that the channel coder 220 unloaded the coded data from the transmission table. In this way, the channel decoder 225 can perform the exact inverse of the process performed by the channel coder 220. For example, the channel decoder 225 loads the coded data into the reception table in the same way (e.g., by row) that the channel coder unloaded the coded data from the transmission table, decodes the coded data in the same way (e.g., by column) that the channel coder 220 coded the data, and unloads the decoded data from the reception table in the same way that the channel coder 220 loaded data into the transmission table. In other words, the transmit side and receive side processes are symmetrical so as to enable (ideally) the data stream to be reliably communicated to the receiver via a wireless channel.

The channel decoder 225 performs error correction using the error correction features provided by the coding scheme (e.g., SEC for Hamming, SECDED for extended Hamming) and any other additional error correcting algorithms to detect and/or correct bit errors in the data of the coded segment. It is appreciated that bit errors may arise due to noise and/or interference that occurs during transmission over the wireless channel (e.g., link 135) and/or reception errors. Upon performing the error correction of the data, the channel decoder 225 extracts (e.g., unloads) the corrected data from the table (e.g., reception table) and outputs the corrected data (e.g., a data stream of corrected data. In some embodiments, the channel decoder 225 may perform de-interleaving, as discussed herein, by unloading the data in a different way than the coded data is loaded into the table (in an inverse way as to the way the transmission table was loaded and unloaded by the channel coder 220, for example) to further reduce noise corruption.

The chirp division multiplexing module 230 implements chirp division multiplexing. Chirp division multiplexing has at its core, Chirp Spread Spectrum, which utilizes chirp pulses for the transmission of each symbol of data. A chirp pulse is a sinusoidal signal whose frequency increases (or decreases) (e.g., linearly) over the duration of the chirp pulse. A single symbol of data is spread over the entire bandwidth of the chirp pulse making it robust to channel noise. The symbol size, the chirp bandwidth, and the spreading rate (based on the Spreading Factor), are all configurable making the technology scalable.

Chirp division multiplexing is characterized by strategic usage of combinations of spreading factors and chirp bandwidth. It is appreciated that different combinations of spreading factors and chirp bandwidth can have similar throughput. For example, the combination of Spreading Factor 12 with a 500 KHz chirp bandwidth has approximately similar throughput as Spreading Factor 11 with 250 KHz chirp bandwidth. It is further appreciated that different Spreading Factors (as implemented, for example) are orthogonal to each other, regardless of the chirp bandwidth being used. Chirp division multiplexing leverages these aspects of orthogonality and similar throughput rates to multiplex different data streams having different spreading factors on the same frequency resources. Accordingly, the chirp division multiplexing module 230 may select a Spreading Factor and a chirp bandwidth size to optimize streaming throughput given the available frequency resources, through the use of chirp division multiplexing. The chirp division multiplexing module 230 may use chirp division multiplexing to optimize streaming throughput of individual data streams as well as maximize available resources (e.g., possible streams) for one or more data streams.

In addition to chirp spreading, the chirp division multiplexing module 230 may also utilize frequency hop spread spectrum signaling to further enhance the robustness to channel noise. The overall effectiveness is seen in chirp division multiplexing's performance in non-line-of sight environments where the communications link is relegated to only multipath signals with no direct signal path to rely on.

In some embodiments, the described systems, methods, and devices operate in the 800 MHz-1000 MHz frequency range (e.g., 902 MHz-928 MHz (the industrial scientific, and medical (ISM) radio band in the U.S., for example), 863 MHz-870 MHz (a license free band in Europe, for example)) and target data rates in the 300 bps to 10 kbps range to allow for maximum range and reliability in that frequency range. In other embodiments, the described systems, methods, and devices may operate in any of a variety of other frequency ranges (e.g., 433.05 MHz-434.79 MHz, 2.4 GHz-2.5 GHz, 5.725 GHz-5.875 GHz, 24 GHz-24.25 GHz, in the ISM radio bands, for example) and target data rates to allow for maximum range and reliability in those respective frequency ranges.

The chirp division multiplexing module 230 includes a chirp modulator 240, and a chirp demodulator 245. The chirp division multiplexing module 230 takes a coded data stream (the output of channel coder 220, for example) and modulates the coded data stream for transmission over a wireless link (e.g., communication link 135). The chirp division multiplexing module 230 may similarly receive a modulated coded data stream from a wireless link (e.g., communication link 135) and may demodulate the coded data stream to provide a received coded data stream (the digital input to the channel decoder 225, for example).

The chirp modulator 240 modulates a fixed length of data or code (e.g., coded data from the channel coder 220) to a chirp symbol that represents that fixed length of data or code (e.g., 128 bits, corresponding to a 32 bit by 32 bit error correction table (e.g., table 300)). The chirp modulator 240 may include a codebook that matches a unique chirp symbol to each possible code in the codebook. In some embodiments the size of the code (e.g., the bit length of the code) may be matched to align with the bit length (e.g., 128 bits based on a 32 bit by 32 bit error correction table) of the coded segment produced by the channel coder 220.

The chirp modulator 240 (e.g., data modulator) matches one or more input coded segments (depending on the bit length of the codes in the codebook being used, for example), which corresponds to a code, to a chirp symbol (e.g., a cyclically shifted version of the chirp signal) that represents the code. The chirp modulator 240 may generate a unique chirp symbol by cyclically shifting the chirp signal so as to correspond to the matched code (the code that corresponds to the one or more input coded segments, for example). It is appreciated that the number of codes may be matched so as to equal the number of possible cyclic shifts of the chirp signal, so that there is a one-to-one relationship between cyclic shifts of the chirp signal (e.g., chirp symbols) and codes in the codebook. The chirp modulator 240 may generate the chirp symbols by cyclically shifting a chirp symbol or using alternative methods to generate a cyclically shifted version (e.g., chirp symbol) of a chirp signal. In some embodiments, the chirp modulator 240 may chain up a sequence of unique chirp symbols (in a manner that creates a continuous transition between chirp symbols, for example) to improve transmission properties associated with transmission in the frequency domain (via transmitter 260, for example).

The chirp demodulator 245 (e.g., data demodulator) demodulates a chirp symbol (e.g., cyclically shifted version of a chirp signal) by matching the cyclic shift to the code from the codebook that corresponds to that cyclic shift. The chirp demodulator 245 uses the same codebook used by the chirp modulator 240. The codebook matches each unique chirp symbol (e.g., each possible cyclic shift of the chirp signal) to each possible code in the codebook. The chirp demodulator 245 detects a unique chirp symbol (using a matched filter, for example) and matches the unique chirp symbol (e.g., unique cyclic shift of the chirp signal) to the code associated with that unique chirp symbol (e.g., unique cyclic shift) based on the codebook to recover the code (the fixed length of data that represents the coded segment, for example). The application of the matched filter results in a high (e.g., greater than 1) BWP in the bucket corresponding to a particular cyclic shift of the chirp signal. The chirp demodulator 245 may use the matched filter to identify each unique chirp symbol (by identifying the cyclic shift associated with the chirp symbol, for example) based on the BWP peak in one of the buckets (corresponding to a specific cyclic shift of the chirp signal, for example).

As discussed in further detail herein, the nature of matched filtering chirp signals/symbols produces very high gain, allowing for easier identification of the cyclic shift associated with each unique chirp symbol, which when identified, can easily be matched to the corresponding code, based on the codebook. In some embodiments the size of the code (e.g., the bit length of the code) may be matched to align with the bit length of the coded segment corresponding to the selected coding schemed (e.g., Hamming(8/4)). The chirp demodulator 245 may produce a sequence of codes (e.g., coded segments) based on a chained sequence of unique chirp symbols.

The transceiver 255 includes a transmitter 260 and a receiver 265. The transmitter 260 includes the wireless communications hardware for transmitting a stream of chained together unique chirp signals. The transmitter 260 may include circuitry, such as amplifiers and antennas to transmit generated chirp signals (symbols generated by the chirp modulator 245, for example). The receiver 265 includes the wireless communications hardware for receiving a stream of chained together, unique, chirp signals.

It is appreciated that the chirp division multiplexing modulation scheme (referred to herein simply as chirp modulation) is both frequency and bandwidth scalable. The Spreading Factor (SF) which determines the number of chips per chirp symbol can be easily be reconfigured as well as the bandwidth occupied by the chirp symbol, even on the fly. These factors are typically chosen from a trade-off between robustness and data bandwidth for given applications. Also, the bandwidth size and number of hopping frequencies are easily configurable which not only helps with efficient use of the allocated frequency band, after adapting to various modulations schemes, but makes it relatively easy to adapt to regional frequency regulations around the world.

Chirp modulation is inherently easily adapted to incorporate frequency hopping spreading in addition to the chirp spreading. This is due to both the packet format/size and the rapid acquisition process described herein. In some embodiments, Frequency Hopping (FH), which is another form of spread spectrum, may be combined with chirp spread spectrum (via the chirp division multiplexing module 230, for example) to further enhance the performance of chirp division multiplexing technology. Chirp division modulation may utilize FH for addition immunity to noise and to add multiple access capability. In some embodiments, 72 pseudorandom, table driven frequencies may be used. In one example, these 72 pseudorandom, table driven frequencies are scalable to adapt to any regional requirement worldwide, or to adapt to symbol bandwidths. Proprietary algorithms may be implemented for table synchronization and adaptation for minimizing frequency dwell time performance per regional regulatory requirements. In some cases, these FH techniques may be referred to as "Spectrum Impact Smoothing."

Inherent to chirp modulation is the ability to multiplex packet transmissions not only based on the time of the chirp, but also based on the properties of the chirp such as rate of frequency change, and phase. The Spreading Factors (SF) mentioned above can be and are chosen such that they are orthogonal to each other (enabling chirp division multiplexing, for example). This means that multiple chirp bursts with different SFs can be transmitted simultaneously on the same frequency and received simultaneously, where the receivers are tuned to the specific SF, without colliding or needing to be retransmitted. Each receiver "matched filter" will only detect the burst to which it is tuned based on SF. This not only creates an opportunity for multiple access to aid in networking but also for different node types to operate adjacently without congesting the RF space.

Two tables are presented below illustrating a comparison of chirp spread spectrum with chirp division multiplexing. In addition, the two tables illustrate the feasibility of voice over the respective radio links. The two tables assume use of the 902 MHz-928 MHz frequency range, which is divided into 72 frequency channels (e.g., 71 hopping frequency channels and 1 default frequency channel).

Table 2 summarizes a the case of chirp spread spectrum (i.e., not chirp division multiplexing) where a single Spreading Factor (e.g., performance group) is used based on a bandwidth of 500 Khz for each of four (4) different packet sizes. With only a single spreading factor being used (i.e., chirp spread spectrum) the 72 available frequency channels provide 72 usable frequency channels (i.e., a 1:1 mapping). It is appreciated that packet sizes are a way of overcoming the fixed overhead per packet but represent a balance between Forward Error Correction/Interleaving and throughput. There are 3 performance groups listed with group B being a baseline value, group A being one level better and group C being one level worse. With this first case there are two possible supporting network implementations. First is a collision-based random-access network with only 71 hopping frequency channels available (instead of the 215 hopping frequency channels available with chirp division multiplexing, for example) and a significant penalty for probability for collisions. Second is a collision-avoidance network with a more complicated network scheme such as frequency division multiplexing (beacon based), which is partially what MULTI-VOICE implements.

Table 3 summarizes a case of chirp division multiplexing where 3 Spreading Factors (e.g., performance groups) are used simultaneously to multiply the 72 available frequency channels into 216 usable frequency channels (e.g., 3×72=216, 215 hopping frequency channels and 1 default frequency channel) (i.e., a 1:3 mapping). The 3 spreading factors are used based on a bandwidth of 125 Khz-500 Khz for each of 4 different packet sizes. In Table 2 there are 3 performance groups listed (similar to Table 1) with group B being a baseline value. Because different spreading factors are orthogonal, chirp division multiplexing division multiplies the available frequency channels by the number of spreading factors that can be simultaneously used on a particular frequency (e.g., 3 spreading factors×72 usable frequency channels=216 usable frequency channels or 215 hopping frequency channels+1 default frequency channel. This second case uses a collision-based random-access networking system using 215 hopping frequencies.

The tables consider the difference between acknowledgement (ACK) (e.g., handshaking) and no acknowledgment (No ACK) (e.g., no handshaking) cases. Depending on the packet size, one (1) handshake per audio streaming packet can further reduce the throughput but can provide value. Without handshaking, link establishment and maintenance must be performed prior to, and between streaming sessions, such as when the push-to-talk button is pressed. With handshaking, link establishment and maintenance can be ongoing and can provide statistical information. Additionally, handshaking can be implemented with two parts, one (cyclic redundancy check (CRC)) for the header and one (CRC) for the audio payload.

The tables also assume that forward error correction (FEC) and interleaving are always used (e.g., on). It is assumed that voice quality and link performance require FEC. Interleaving may also be combined with FEC to provide burst error protection.

The tables additionally assume that the communication link is push-to-talk based and half duplex. It is assumed that all measurements are based on push-to-talk with one sender and one listener (also purpose handshaking, for example). However, this does not preclude other scenarios such as an arbitrated sender and many listeners.

Table 2 considers what is possible without limits (assuming 71 hopping frequencies, for example). As illustrated in Table 2, performance group A (e.g., SF 12) provides less performance but supports good data rate, performance group B (e.g., SF 11) provides good performance and supports better data rate, and performance group C (e.g., SF 10) provides the best performance and supports the best data rate.

TABLE 2

71 Hopping Frequency Audio Streaming and Vocoder Choices

| Performance | Spreading Factor (SF) | Streaming Pack Size (Bytes) | FEC/ Interleave | Net Data Rate (No Ack) | Net Data Rate (With Ack) |
|---|---|---|---|---|---|
| A | 12 | 16 | Yes | 294 | 173 |
|   | 12 | 64 | Yes | 582 | 470 |
|   | 12 | 128 | Yes | 650 | 577 |
|   | 12 | 256 | Yes | 691 | 648 |
| B | 11 | 16 | Yes | 554 | 328 |
|   | 11 | 64 | Yes | 1076 | 875 |
|   | 11 | 128 | Yes | 1202 | 1071 |
|   | 11 | 256 | Yes | 1271 | 1195 |
| C | 10 | 16 | Yes | 1021 | 615 |
|   | 10 | 64 | Yes | 1983 | 1624 |
|   | 10 | 128 | Yes | 2194 | 1965 |
|   | 10 | 256 | Yes | 2313 | 1866 |

Table 3 considers what is possible with current limitations (assuming 215 hopping frequencies, for example). As illustrated in Table 2, performance group A (which enables simultaneously use of SF 12, SF 11, SF 10 on each frequency channel, thus tripling the usable channels, for example) provides less performance but supports fair data rate, performance group B (which enables simultaneously use of SF 11, SF 10, SF 9 on each frequency channel, thus tripling the usable channels, for example) provides good performance and supports good data rate, and performance group C (which enables simultaneously use of SF 10, SF 9, SF 8 on each frequency channel, thus tripling the usable channels, for example) provides the best performance and supports the best data rate.

TABLE 3

215 Hopping Frequency Audio Streaming and Vocoder Choices

| Performance | Spreading Factor (SF) | Streaming Pack Size (Bytes) | FEC/ Interleave | Net Data Rate (No Ack) | Net Data Rate (With Ack) |
|---|---|---|---|---|---|
| A | 12, 11, 10 | 16 | Yes | 255 | 154 |
|   | 12, 11, 10 | 64 | Yes | 496 | 406 |
|   | 12, 11, 10 | 128 | Yes | 548 | 491 |
|   | 12, 11, 10 | 256 | Yes | 578 | 546 |
| B | 11, 10, 9 | 16 | Yes | 485 | 294 |
|   | 11, 10, 9 | 64 | Yes | 897 | 743 |
|   | 11, 10, 9 | 128 | Yes | 992 | 894 |
|   | 11, 10, 9 | 256 | Yes | 1045 | 898 |
| C | 10, 9, 8 | 16 | Yes | 883 | 539 |
|   | 10, 9, 8 | 64 | Yes | 1615 | 1345 |
|   | 10, 9, 8 | 128 | Yes | 1777 | 1607 |
|   | 10, 9, 8 | 256 | Yes | 1863 | 1768 |

FIG. 3 is a block diagram illustrating an error correction table 300. The error correction table 300 may be used as a transmission table (by the channel coder 220, for example) and/or as a reception table (by the channel decoder 225, for example).

On the transmission side, data segments of length D (e.g., D=26 bits) are sequentially loaded into table 300. In this case, the data is loaded in by row. For example, data 305-*a* is loaded into the first row, data 305-*b* is loaded into the second row, and so forth. In some embodiments, Q sequences of D bits are loaded. While Q (e.g., Q=26) may be equal to D, as illustrated in table 300, Q may be different than D in other embodiments. It is appreciated that as loaded into the table the block of Q sequences of D bits occupies only a portion of the M by N table 300, where M equals 32 and N equals 32 (in this case).

The channel coder 220 may encode the data (e.g., Q sequences of D bits) in any of a variety of ways, such as by row and then by column and by column and then by row. In this example, the channel coder 220 encodes the data by row and then by column. Accordingly, 26 bits of data 305-*a* are encoded using extended Hamming (32,26) which adds 6 bits of parity 310-*a* to generate a first codeword of length M, where M equals 32. Similarly, data 305-*b* is encoded to generate another codeword that includes parity 310-*b*, and so forth for each of the Q rows. As a result of this first encoding, the table 300 is now filled with first codewords (by row) and is of size M by Q (M×Q).

In table 300 the data is arranged that is may be encoded by row and/or by column. As described herein, the data is encoded both by row and by column. Accordingly, the channel coder 220 may now encode the columns (of length Q) of table 300. For example, data 315-*a*, which is the first column of table 300 is encoded using extended Hamming (32,26) which adds 6 bits of parity 320-*a* to generate a second codeword of length N, where N equals 32. Similarly, data 315-*b* is encoded to generate another codeword that includes parity 320-*b*, and so forth for each of the M columns. It is appreciated that the M columns include both data columns (e.g., D columns, 26 D columns in this case) and parity columns (6 P parity columns, in this case), which means that as the parity columns are encoded the additional parity is parity on parity 325. In this example, the parity on parity 325 is a 6 bit by 6-bit matrix (e.g., P by P matrix). Thus, the encoding may be by row and then column or by column and then by row with comparable results, except for a change in direction in which the parity on parity 325 applies. As a result of this second encoding, the table 300 is now filled with second codewords (by column) and is of size M by N (M×N).

As noted above, the coded data may be unloaded in any of a variety of directions (e.g., by row, by column, diagonally, etc.) from the table 300. The coded data is then transmitted through a wireless channel and a coded data stream (along with any interference or noise, for example) may be received by the channel decoder 225.

On the reception side, N coded data segments of length M (e.g., M=32 bits) are sequentially loaded into table 300. In this case, the coded data is loaded into the table 300 in the same (e.g., complimentary) way (e.g., by row, by column, diagonally, etc.) that the coded data was unloaded from the table by the channel coder 220 on the transmit side. With the coded data loaded into the table 300, the channel decoder 225 may decode the codewords including correcting any correctable bit errors and identifying any uncorrectable bit errors (as enabled by the error correction scheme being used).

The channel decoder 225 may decode the coded data based on the error correction scheme. Depending on the error correction scheme being used, different bit error correction may be possible. In general, an error correction scheme can detect a single bit error. Single bit errors may be correctable or may be uncorrectable and an error correction scheme may determine if the single bit error is correctable or uncorrectable. Some error correction schemes (e.g., extended Hamming that provides SECDED) also enable double bit error detection. It is appreciated that the error correction ability depends on the error correction coding rate/effective bit rate (e.g., percentage of data bits to parity bits, or percentage of data bits to total bits). The channel decoder 225 may decode coded data, correcting and/or detecting bit errors as it is able to return data. It is appreciated that uncorrectable bit errors will result in missing/incorrect data unless the data is retransmitted and able to be decoded accurately.

Because of the table structure and the described error correction scheme (with data being coded in multiple different ways, for example), the channel decoder 225 has several options for scanning and/or decoding the data. These include a single scan on a single row, which is repeated for each next row, a single scan on a single row and then a single column, which is repeated for each next row/next column pair, a single scan on a single column, which is repeated for each next column, and a single scan on a single column and then a single row, which is repeated for each next column/next row pair. In addition, the ordering of scanning and/or correction is significant. For example, it may be beneficial to scan and/or correct the parity associated with the parity on parity before using any of the above scanning/correction approaches (e.g., by row, by column, etc.). That is, by correcting the parity on parity first, the following correction of data would be benefited by having corrected parity.

Because of the interrelationship between the error correction coding (e.g., by row and then by column (or by column and then by row) in the table 300) as the table is scanned or iteratively worked through corrections on both column and row benefit corrections on the other. Accordingly, a row that was previously identified as having an uncorrectable double bit error following a row by row scanning/correction may have one or more bits corrected as a result of a column by column scanning/correction such that if the previously uncorrectable bit error may be a correctable single bit error that is correctable by scanning/correcting row by row again. Accordingly, multiple passes, and/or arrangements of row then column scanning/correction may enable enhanced data correctability.

Although multiple scanning/correcting passes on table 300 requires time, the communicate rate at which chirp communications are communicated in contrast to the high clocks and processing power that is available, enables additional processing to be carried out in real time. This additional real time processing enables enhanced error correction, which allows for longer distant communication and/or allows for lower spreading factors to be used while still maintaining data communication reliability.

In contrast to hard decision (e.g., hard decoding thresholds) error correction schemes, such has Hamming codes, the described systems, methods, and devices may use soft decision (e.g., adjustable decoding thresholds) error correction schemes. Such soft decision error correction requires additional information for making the soft decision. As described herein, the received signal strength (e.g., received signal strength indicator (RSSI)) of a chirp signal (e.g., codeword/chirp level based) or portion of a chirp signal (e.g., bit level based) may be used to make soft decoding decision.

In some embodiments, the scanning/correction algorithm enables uncorrectable codewords (e.g., a column or a row) to be skipped while remaining correctable codewords are scanned/corrected, with any skipped codewords to be retried for scanning/correction following the correction of other bit errors (e.g., at least a portion of the remaining codewords). As noted above, this may enable otherwise uncorrectable bit errors to be skipped, retried, and corrected based on the results of other bit error corrections.

Figure 4:
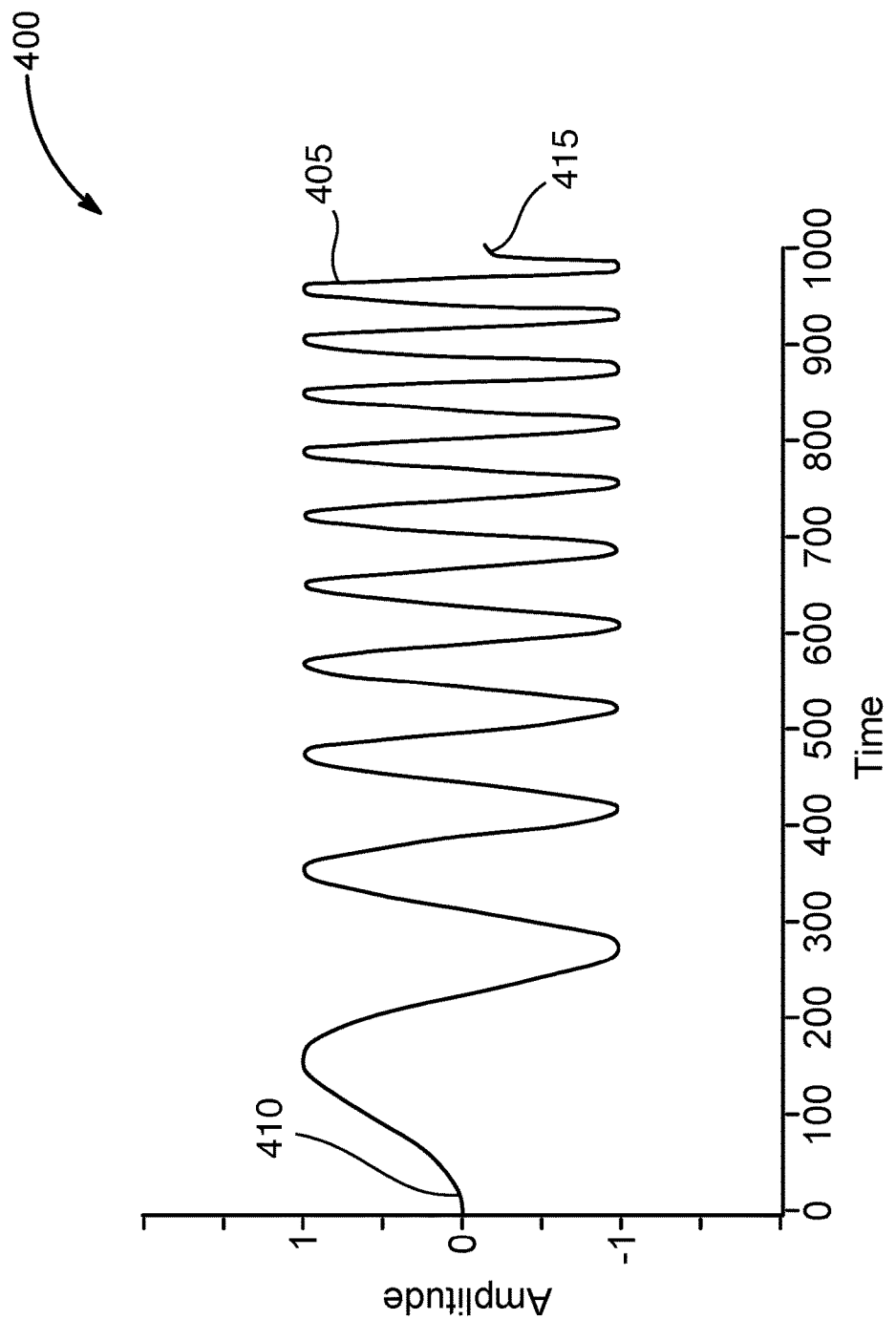
FIG. 4 is a line diagram illustrating one example of a chirp waveform.

FIG. 4 is a line diagram 400 illustrating one example of a chirp waveform 405 (also referred to herein as a chirp pulse 405, or chirp signal 405 and may also be referred to as a sweep signal 405). As used herein a chirp symbol is a cyclically shifted version (including no cyclic shift, for example) of the chirp signal 405 (e.g., the chirp waveform 405). The chirp waveform 405 includes changing frequency content (e.g., increasing frequency content (e.g., up chirp) or decreasing frequency content (e.g., down chirp)) over time and begins at a first frequency 410 and ends at a second frequency 415. The chirp waveform 405 illustrated in FIG. 4 is a linear up chirp and the frequency content increases linearly between the first frequency 410 and the second frequency 415. Although a linear up chirp waveform 405 is shown, it is appreciated that a chirp waveform 405 may take any of a variety of forms (e.g., down chirp, nonlinear, etc.) without departing from the scope of the described devices, systems, and methods.

In chirp division multiplexing, each chirp waveform 405 consists of two (2) to the power of the selected spreading factor (SF) (i.e., 2^SF) number of incrementing frequency chips (e.g., bins, buckets). This is similar to the chipping rate where each chirp waveform 405 has a chipping rate of two (2) times the spreading factor (i.e., 2*SF), for example. In some embodiments, the incrementing frequency chips are generated by a lookup table and input to a Numerically Controlled Oscillator (NCO). The same NCO can be used by the transmitter (e.g., chirp modulator 240) to generate the transmitted chirp waveform 405 and reused by the receiver (e.g., chirp demodulator 245) to generate a conjugate chirp waveform 405 (e.g., chirp signal) used to multiply against each of the received chirp chips (according to clocks of the chipping rate clock, for example). This product of the conjugate chirp waveform 405 multiplied by each received chirp chip is stored and run through a Fast Fourier Transform (FFT) processor. It is appreciated that the use of a linear chirp signal allows for a special (i.e., simplified) case of cross correlation which is accomplished via the matched filtering. When a received preamble chirp waveform 405 or data chirp waveform 405 is found in the product, one of the FFT bins will be significantly larger in value than any other (i.e., BT>>1). The specific bin number will correlate directly to the TX/RX timing offset for a preamble chirp waveform 405 and will correlate directly to a data value for a data chirp waveform 405 (a form of pulse position modulation, for example). The number in the largest bin corresponds with the time-bandwidth (BT) product which also corresponds to the energy of the chirp pulse 405. In chirp division multiplexing, the BT product is greater (i.e., much greater) than 1 (e.g., BT>>1). This high BT product ensures reliability and robustness of chirp division multiplexing.

Chirp pulses 405 are unique due to their high spectral energy/density, which makes them very robust and resistant to multipath, noise and other impairments. This is due to the high time-bandwidth product, or BT, associated with chirp pulses 405. In contrast to traditional spread spectrum communication systems where BT is typically smaller than 1 (e.g., BT<1) and inversely proportional to spreading rate (considered as the processing gain, for example), with chirp pulses 405, BT is much larger than 1 and directly proportional to spreading rate (considered as the compression ratio, for example). It is appreciated that, while not precisely accurate, chirped spread spectrum BT can be thought of as the number of frequencies per bit, while standard modulation can be thought of as a number of bits per frequency, which kind of illustrates the odd inverse relationship of their BT.

Because chirp signals 405 have a large time-bandwidth product (BT), during transmission in the channel, both the chirp signal 405 and the noise spread in the wideband. But, at the receiver, the chirp signal 405 produces a pulse peak due to its autocorrelation (via matched filter detection, for example) while the noise is further spread and has relatively small amplitude. This property also contributes to better immunity to jamming, (i.e., narrowband) noise, and multipath impairments. In addition, because the pulse peak has a time duration of 1/B, the higher the time-bandwidth product (BT), the higher the statistical precision in recovering the signal preamble or data and the higher the amount of energy present inside the defined chirp.

Because of the high amount of spectral energy present inside a chirp pulse 405, as evidenced by a high time-bandwidth produce (BT), chirp spread spectrum communications is inherently immune to jamming, (narrowband) noise, multipath, and other impairments. Doppler frequency shifts due to one radio moving relative to the other are relatively insignificant in chirp technology. The overall effect of Doppler is a small shift in the time axis of the received baseband signal. Since the over the air packet is relatively small, the preamble and the data portion of the packet will see the same shift which will automatically be cancelled by the normal receive processing which makes this technology inherently useable in mobile applications.

Figure 5:
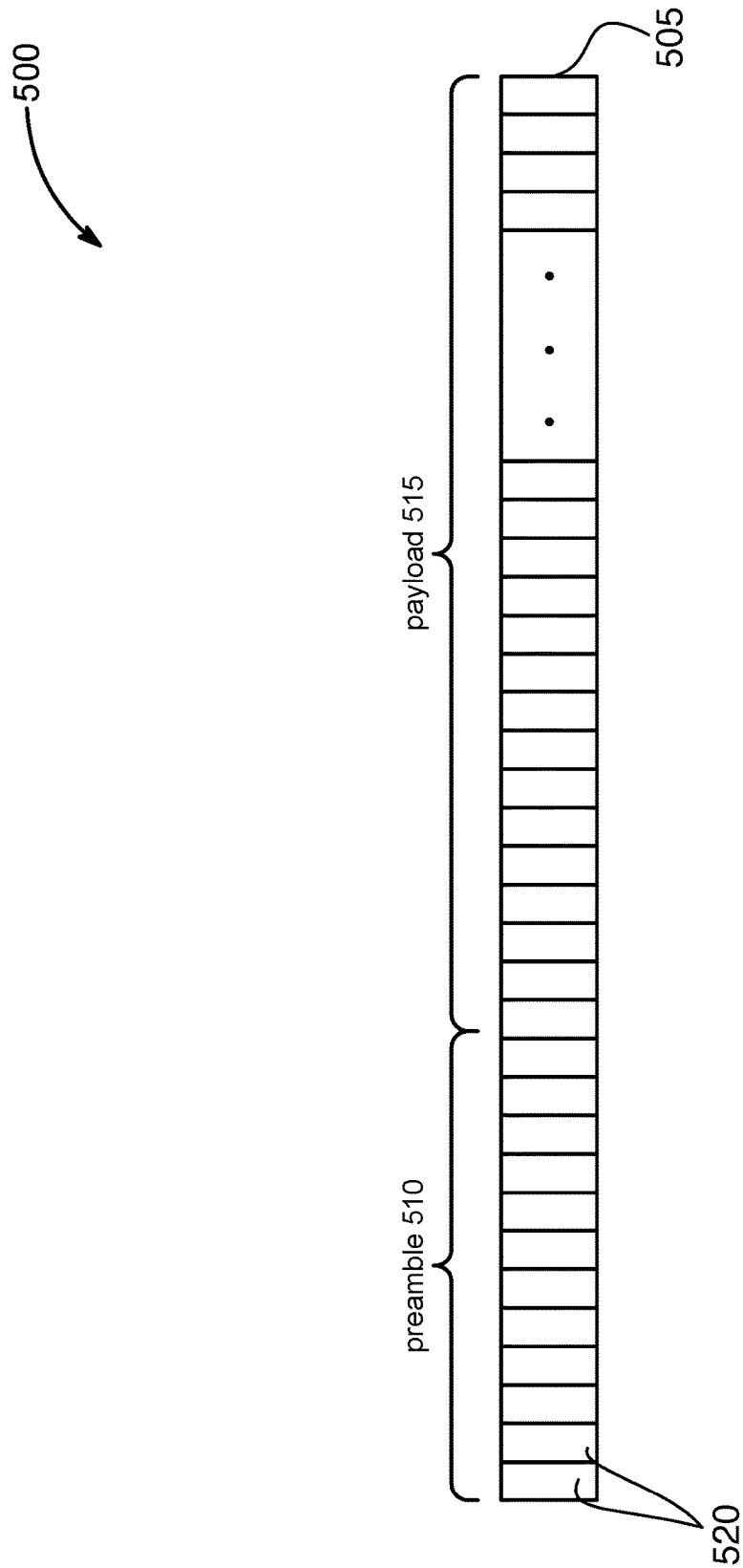
FIG. 5 is a block diagram of a communication frame that may be used with chirp division multiplexing.

FIG. 5 is a block diagram 500 of a communication frame 505 that may be used with chirp division multiplexing. The communication frame 505 (also referred to herein as communication packet 505) includes a plurality of chirp symbols (e.g., chirp waveform 405) structured in time slots referred to as chirps 520. Each chirp 520 slot may correspond to the time duration of the chirp symbol (e.g., selected chirp bandwidth). The communication frame 505 includes a preamble 510 portion that includes x chirps 520 (including, possibly a partial chirp to allow for receive side timing adjustment, for example) and a payload 515 portion that includes n chirps 520 (depending on the size of the data, for example).

In some embodiments, the first y chirps 520 are known chirp training symbols, enabling simple timing synchronization for communication frame 505 reception without requiring complex clock or oscillator synchronization. This is due to the way in which the chirp preamble pulses (e.g., the chirp symbols in the first y chips 520) are correlated (known as matched filtering, also known as pulse compression, for example). The compressed pulses (markers, for lack of better terminology) of the preamble are nearly instantaneously mappable to the timing offset between the timing of the transmitter and the receiver symbol (chirp) timing.

This means that the preamble 510 (i.e., the first part of the over-the-air packet) doesn't need a clock training sequence and the receiver doesn't need a phase lock loop (PLL) or to spend the time to lock onto and recover the clock timing. This also minimizes the time required to cover the possible combinations of frequency and phase shifts a DSSS correlator requires and results in a fast acquisition and low latency. Accordingly, chirp spread spectrum (CSS) systems have an advantage over direct sequence spread spectrum (DSSS) systems in that they require far less local oscillator (e.g., receive clock and transmit clock) precision (e.g., 5 parts per million (ppm)) than do the DSSS based systems (e.g., 40 ppm), which is a cost and hardware advantage.

While the preamble 510 (at least the first y chirps 520, for example) may be known (e.g., consists of known training chirp symbols), the payload 515 includes data with each chirp 520 having one (1) chirp symbol (any of a variety of chirp symbols based on the codebook being used, for example) and must be uniquely detected (via the chirp demodulator 245, for example). In some embodiments, the number of chips 520 in (e.g., length of) the payload 515 is selected to optimize a selected streaming rate.

Figure 6:
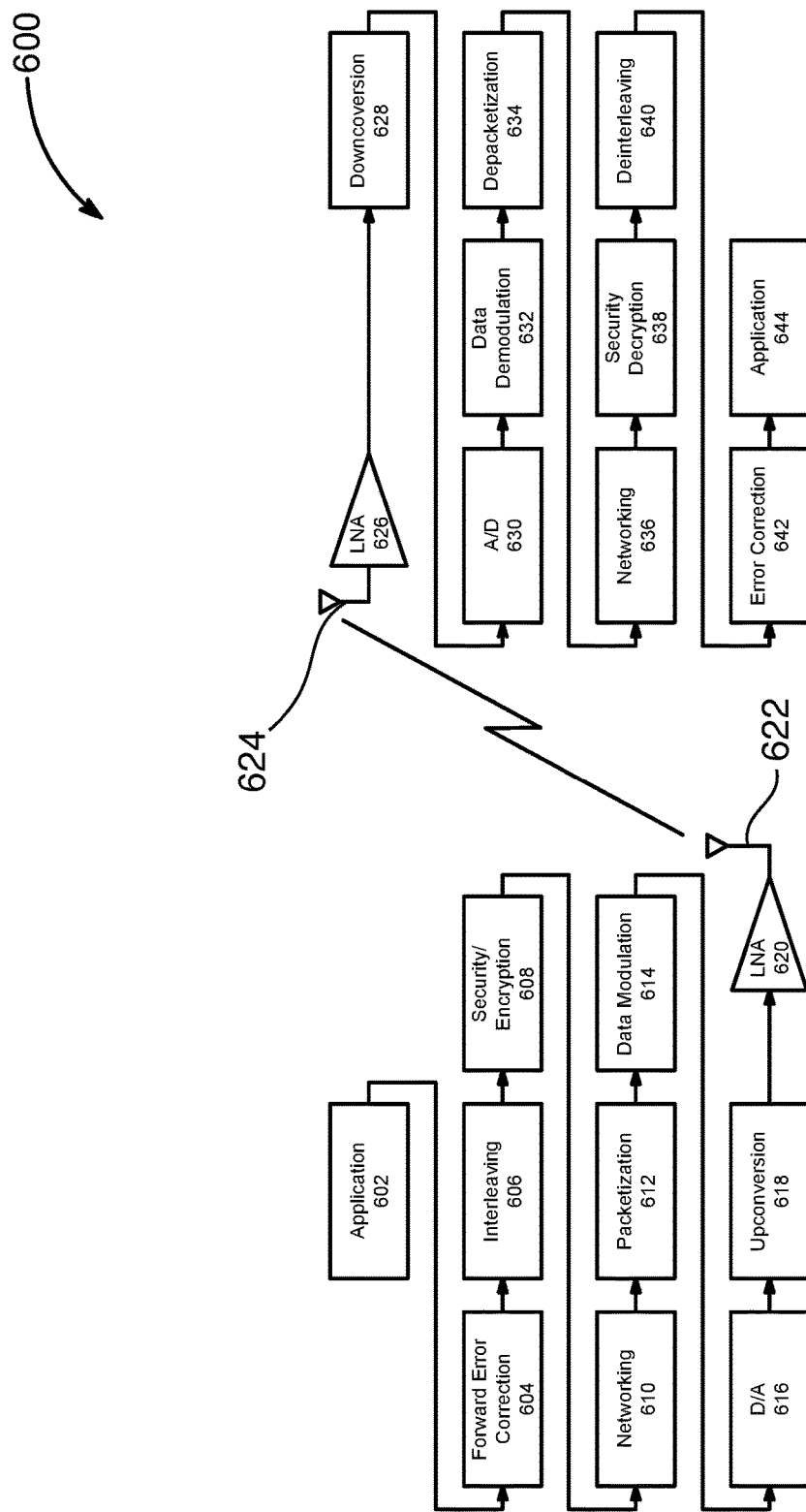
FIG. 6 is a block diagram of an exemplary communication chain having both a transmitter chain and a receiver chain.

FIG. 6 is a block diagram of an exemplary communication chain 600 having both a transmitter chain and a receiver chain. The respective transmitter chain and receive chain of the communication chain 600 may each include hardware (e.g., an application processor, a baseband processor, TX/RX receive circuitry, and the like) to implement the modules described herein. Although the transmit and receive chains are shown as independent chains, it is appreciated that the devices implementing these changes may have both transmit and receive capability and certain functions of each respective chain may be combined (as considered above, for example) to optimize hardware resources, battery resources, and the like. Although, not specifically called out, it is appreciated that the respective transmit and receive chains may each be included in a communication device (e.g., communication device 105-c).

The transmitter chain includes an application 602 (e.g., a data source), a forward error correction module 604, an interleaving module 606, a security/encryption module 608, a networking module 610, a packetization module 612, a data modulation module 614, a digital-to-analog converter (DAC, D/A) 618, an upconversion module 616, a low noise amplifier (LNA) 620, and an antenna 622.

The application 602 (e.g., data source) outputs data (e.g., a stream of data, data stream). The application 602 may be any application or data source that produces/generates/outputs data for transmission. For example, the application 602 may be a messaging (e.g., SMS messaging, email messaging, voice communication) application.

The forward error correction module 604 (e.g., channel coder 220) may code the incoming data stream with an error correction coding scheme (adding redundancy through the use of parity, for example) to improve robustness of the data stream. The result of the error correction coding is a coded data stream. In some embodiments, the forward error correction module 604 may be implemented by a baseband processor.

The interleaving module 606 may interleave the data and/or the coded blocks to randomize the error correction coding. As discussed herein, the interleaving module 606 may be integrated into the forward error correction module 604 and the interleaving module 606 may enable the interleaving based on how (e.g., what direction) the data (or coded data) is loaded into the table (e.g., table 300) and how (e.g., what direction) the coded data (or data) is unloaded from the table. In some embodiments, the interleaving module 507 may interleave the coded blocks using diagonal interleaving as discussed with respect to and illustrated in Table 1.

The security/encryption module 608 may encrypt (or add security to, for example) the coded data stream to secure the coded data stream. For example, the security/encryption module 608 may encrypt the coded data stream using the Advanced Encryption Standard (AES) standard. The security/encryption module 608 converts the coded data stream into an encrypted coded data stream. As security/encryption is optional, the expression "coded data stream" is used, even though the coded data stream may be encrypted (and the coded data stream is actually a ciphered coded data stream, for example) or the coded data stream may be unencrypted (and the coded data stream is, in fact, the uncyphered coded data stream, for example). In some embodiments, the security/encryption module 608 may be implemented by a baseband processor.

The networking module 610 may add networking information to the coded data stream. The networking information includes at least the destination address (e.g., a user ID) of the intended recipient and a sender address (e.g., user ID) of the sender. In some embodiments, the destination address and the sender address may each be represented by a single chirp waveform (e.g., in a single chirp slot). The networking information may be included in the first part of the payload (e.g., payload 515). In some cases, the payload may include one or more blocks (e.g., five (5) blocks) of header information that includes communication details, including networking information, decoding information, interleaving information, frequency hopping information, and the like. In some embodiments, the networking module 610 may be implemented by a baseband processor.

The packetization module 612 may combine a preamble (e.g., preamble 510) with at least a portion of the coded data stream (e.g., a payload 515) to form a packet (e.g., communication frame 505). In some embodiments, the preamble includes X number of training chirps (possibly including a fractional chirp to allow for timing, for example)(e.g., a 12.25 chirp preamble 510). In some embodiments, the packetization module 612 may be implemented by a baseband processor.

The data modulation module 614 (e.g., chirp modulator 240) may generate a chirp symbol (e.g., cyclically rotated chirp waveform 405/chip signal) for each chirp time/bandwidth slot (e.g., chirp 520) in the packet (e.g., communication frame 505) based on the data (e.g., coded blocks, payload) and/or the preamble. In some embodiments, each chirp symbol (corresponding to a particular code in the codebook of available codes, for example) is a cyclically shifted version of the chirp signal (e.g., chirp waveform 405). In such embodiments, the data modulation module 614 may easily generate the chirp symbols using a lookup table and inputting the result of the lookup table to a Numerically Controlled Oscillator (NCO). As discussed herein, the size (e.g., number of buckets/bins) and the duration (e.g., bandwidth) of the chirp waveform is based on a selected spreading factor and a selected bandwidth. The spreading factor and the bandwidth may be selected to optimize/maximize streaming throughput given a particular set of wireless channel conditions. Tables 2 and 3 provide examples of possible spreading factor/bandwidth combinations and their impact on streaming throughput.

The data modulation module 614 may chain up the chirp symbols to generate a baseband chirp signal. In some embodiments, the modulation module 614 may adjust the ends of adjacent chirp symbols to generate a continuous waveform (e.g., baseband chirp signal) that includes the contents of the entire packet (e.g., communication frame 505). In some embodiments, the data modulation module 614 may be implemented by a baseband processor.

The D/A 616 converts the baseband chirp signal from a digital signal to an analog signal in preparation for transmission.

The upconversion module 618 may upconvert and/or modulate the baseband chirp signal to a transmission chirp signal for transmission at a desired frequency (e.g., in the 900 MHz range). In one example, the upconversion module 618 may upconvert the baseband chirp signal to 915 MHz, which is the center frequency in the ISM 902 MHz-928 MHz frequency band, by multiplying the baseband chirp signal with the center frequency in the desired frequency. In some cases, the upconversion module 618 may implement a frequency hopping table that enables maximal utilization of the available frequency resources (e.g., one of 72 channels, in the case of 72 available channels, for example).

The LNA 620 may amplify the transmission chirp signal for transmission via the antenna 622 (as a transmitted chirp signal, for example). The LNA 620 may amplify the power (according to wireless spectrum usage rules, for example) of the transmission chirp signal to maximize propagation distance.

The transmitted chirp signal, which is transmitted by the transmitter chain may be received by the receiver chain as a received chirp signal. The received chirp signal may include noise and/or interference as a result of being transmitted over a wireless channel.

The receiver chain includes an antenna 624, an LNA 626, a downconversion module 628, an analog-to-digital (ADC, A/D) 630, a data demodulation module 632, a depacketization module 634, a networking module 636, a security/decryption module 638, a deinterleaving module 640, an error correction module 642, and an application 644 (e.g., data destination).

The antenna 624 of the receiver chain receives the transmitted chirp signal from the transmitter chain. The LNA 626 may amplify the received chirp signal for processing (e.g., demodulation/detection) the received chirp signal.

The downconversion module 628, which performs a complementary (e.g., the inverse) function of the upconversion module 618, may downconvert and/or demodulate the received signal to a baseband signal for processing. In one example, the downconversion module 628 may down convert the received signal from 915 MHz, which is the center frequency in the ISM 902 MHz-928 MHz frequency band, to a baseband chirp signal.

The baseband signal, which is an analog signal is converted to a digital signal by the A/D converter 630.

The data demodulation module 632 (e.g., chirp demodulator 245), which performs a complimentary (e.g., the inverse) function of the data modulation module 614, may demodulate the baseband signal, by demodulating each chirp symbol (e.g., chirp waveform 405) in each chirp slot (e.g., chirp 520). Data demodulation involves extracting the original information (e.g., the received version of the coded data stream or encrypted coded data stream) from the received chirp waveforms (e.g., chirp symbols). Data demodulation involves identification of the chirp slots (based on the training chirp symbols in the preamble, for example), detection of the chirp symbols within the following chirp slots (e.g., the payload), and matching of the detected chirp symbols with the corresponding code entry based on the codebook, where the resulting codes are the extracted information from demodulating the received chirp waveforms. As discussed with respect to the data modulation module 614, the chirp waveform (e.g., the conjugate chirp waveform used for decoding) is based on the particular combination of spreading factor and bandwidth. In some embodiments, the data demodulation module 632 may be implemented by a baseband processor.

The depacketization module 634, which performs a complimentary (e.g., the inverse) function of the packetization module 612, may take a received packet (e.g., communication frame 505) and separate the preamble (e.g., preamble 510) from the payload (e.g., payload 515). In some embodiments, the depacketization module 634 may be implemented by a baseband processor.

The networking module 636, which performs a complimentary (e.g., the inverse) function of the networking module 610, may read the networking information from the decoded payload. The networking information includes at least the destination address (e.g., a destination identifier) of the intended recipient and a sender address (e.g., sender identifier) of the sender. In some embodiments, the destination address and the sender address may each be represented by a single chirp waveform (e.g., in a single chirp slot). In some embodiments, the networking module 636 may be implemented by a baseband processor.

The security/decryption module 638, which performs a complimentary (e.g., the inverse) function of the security/encryption module 608, may decrypt (or remove security from, for example) the ciphered coded data stream to enable decoding of the coded data stream. For example, the security/decryption module 638 may decrypt the ciphered coded data stream using the Advanced Encryption Standard (AES) standard. The security/decryption module 638 converts the encrypted coded data stream into an unencrypted coded data stream. As security/encryption/decryption is optional, the expression "coded data stream" is used, even though the coded data stream may be encrypted (and the coded data stream is actually a ciphered coded data stream, for example) or the coded data stream may be unencrypted (and the coded data stream is, in fact, the uncyphered coded data stream, for example). In some embodiments, the security/encryption module 638 may be implemented by a baseband processor.

The de-interleaving module 640 may de-interleave the coded blocks, as discussed herein, to remove the randomization of the error correction coding. As discussed herein, the de-interleaving module 640 may be integrated into the error correction module 642 and the de-interleaving module 640 may enable the de-interleaving based on how (e.g., what direction) the data (or coded data) is loaded into the table (e.g., table 300) and how (e.g., what direction) the coded data (or data) is unloaded from the table. For example, the de-interleaving module 640 (in combination with the error correction module 642, for example) may build a table (e.g., table 300 as illustrated in FIG. 3) of coded blocks, putting the received coded blocks into the table in a diagonal fashion (as illustrated in Table 1, for example) (opposite the way that the interleaving module 606 pulled the coded blocks out of the table, by color, for example) and then pulling out of the table either by row or column (complimentary to the way that the interleaving module 606 put the coded blocks into of the table (e.g., by column) so as to produce the properly ordered sequence of coded blocks, for example). In some embodiments, the de-interleaving module 640 may de-interleave the coded blocks so as to undo the output of the interleaving module 606 (e.g., undo the diagonal interleaving as discussed with respect to and illustrated in Table 1).

The error correction module 642 (e.g., channel decoder 225), which performs a complimentary (e.g., the inverse) function of the forward error correction module 604 (e.g., channel coder 220) may decode the coded data stream with an error correction coding scheme (using redundancy through the use of parity to detect and/or correct errors, for example) to improve robustness of the data stream. Because the error correction coding adds bits (e.g., parity) that enable correction, the decoding process enables and allows error correction on the receive side (i.e., at the error correction module 642). The error correction module 642 may provide the maximum error correction enabled by the forward error correction coding scheme, including techniques such as iterative decoding. The result of the error correction module 642 may be a data stream.

In the case of different coding schemes used within the packet, the error correction module 642 (e.g., decoding module) may utilize different error correction schemes for different portions of the coded data stream. In some cases, extended Hamming codes, which enable single error correction double error detection (SECDED), may be used to detect single our double bit errors and to correct certain single bit errors. In some cases, bit errors (as a result of communication via a noisy wireless channel, for example) may be corrected (using the error correction features of the coding scheme, for example). In other cases, bit errors may be detected, but may not be correctable. In such cases, decisions may be made whether to use data with corrected errors, use data with uncorrected bit errors, or to ignore data with uncorrectable bit errors (and request retransmission, for example). It is appreciated that forward error correction coding in combination with other tactics, such as interleaving, may be used in advanced decoding schemes to further reduce bit errors. For instance, burst errors may be reduced by diagonal interleaving as discussed previously. The result of the error correction decoding is a decoded data stream. In some embodiments, the decoding module 642 may be implemented by a baseband processor.

The application 644 (e.g., data destination) receives data (e.g., a stream of data, data stream) as an input. The application 644 may be any application or data destination that receives/obtains data from a transmission. For example, the application 644 may be a messaging (e.g., SMS messaging, email messaging, voice communication) application.

The same process discussed above may be repeated, going the other direction, for example, to enable two-way communication. It is appreciated that using the described techniques, two-way voice communication may be achieved over a chirp spread spectrum link (using chirp division multiplexing, for example).

Figure 7:
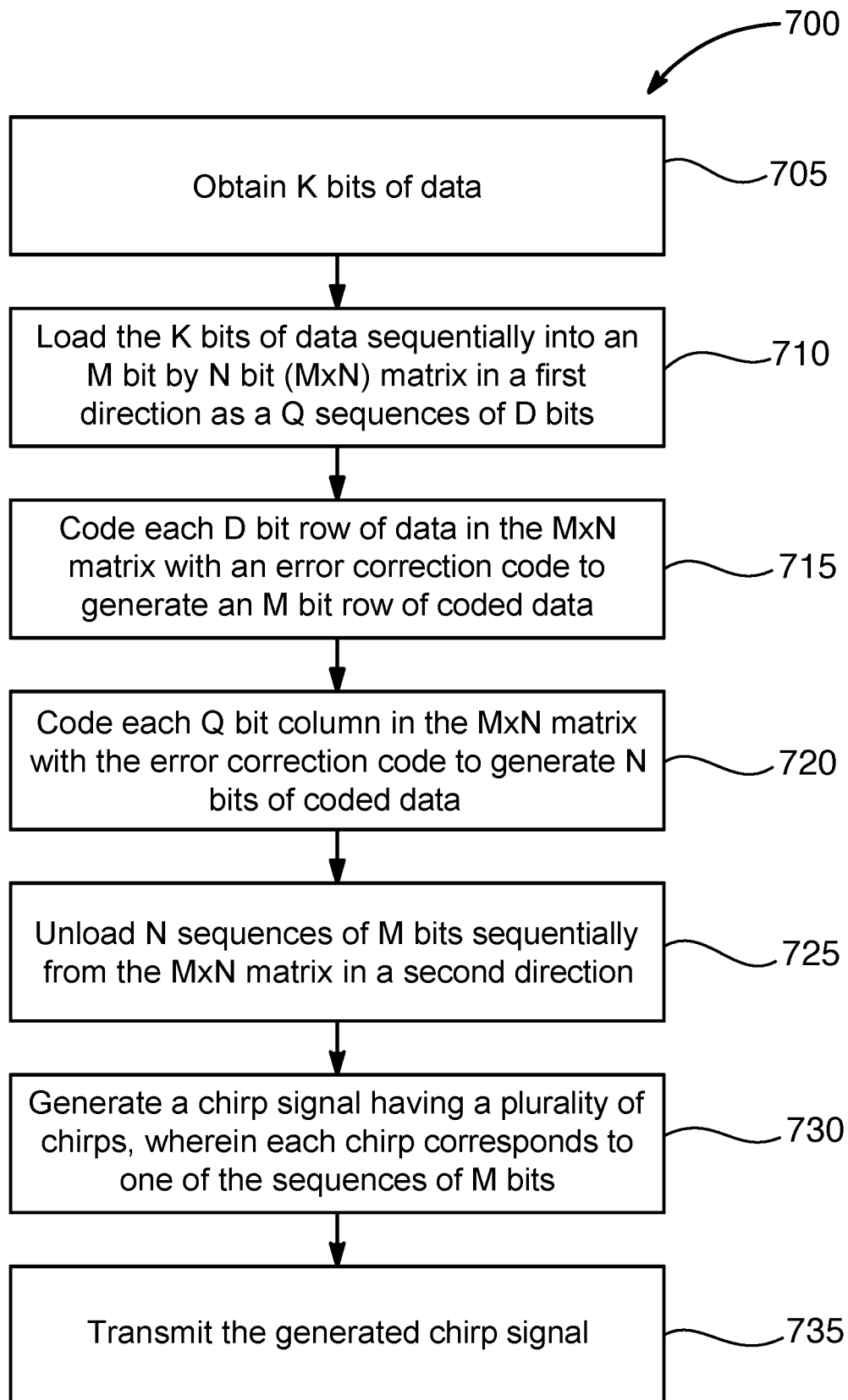
FIG. 7 is flow diagram illustrating one example of a method for error correction coding with chirp spread spectrum.

FIG. 7 is flow diagram illustrating one example of a method 700 for error correction coding with chirp spread spectrum. The method 700 may be implemented by a mobile device (e.g., mobile device 105) and more specifically by an application specific processor (e.g., processor 1110) included within the mobile device.

At 705, K bits of data are obtained. At 710, the K bits of data are sequentially loaded into an M bit by N bit (M×N) matrix in a first direction as Q sequences of D bits. At 715, each D bit row in the M×N matrix is coded with an error correction code to generate an M bit row of coded data. At 720, each Q bit column in the M×N matrix is coded with an error correction code to generate N bits of coded data. At 725, N sequences of M bits are sequentially unloaded from the M×N matrix in a second direction. The second direction may be different than the first direction (to facilitate interleaving, for example). At 730 a chirp signal having a plurality of chips is generated, where each chirp corresponds to one of the sequences of M bits. At 735, the generated chirp signal is transmitted.

Figure 8:
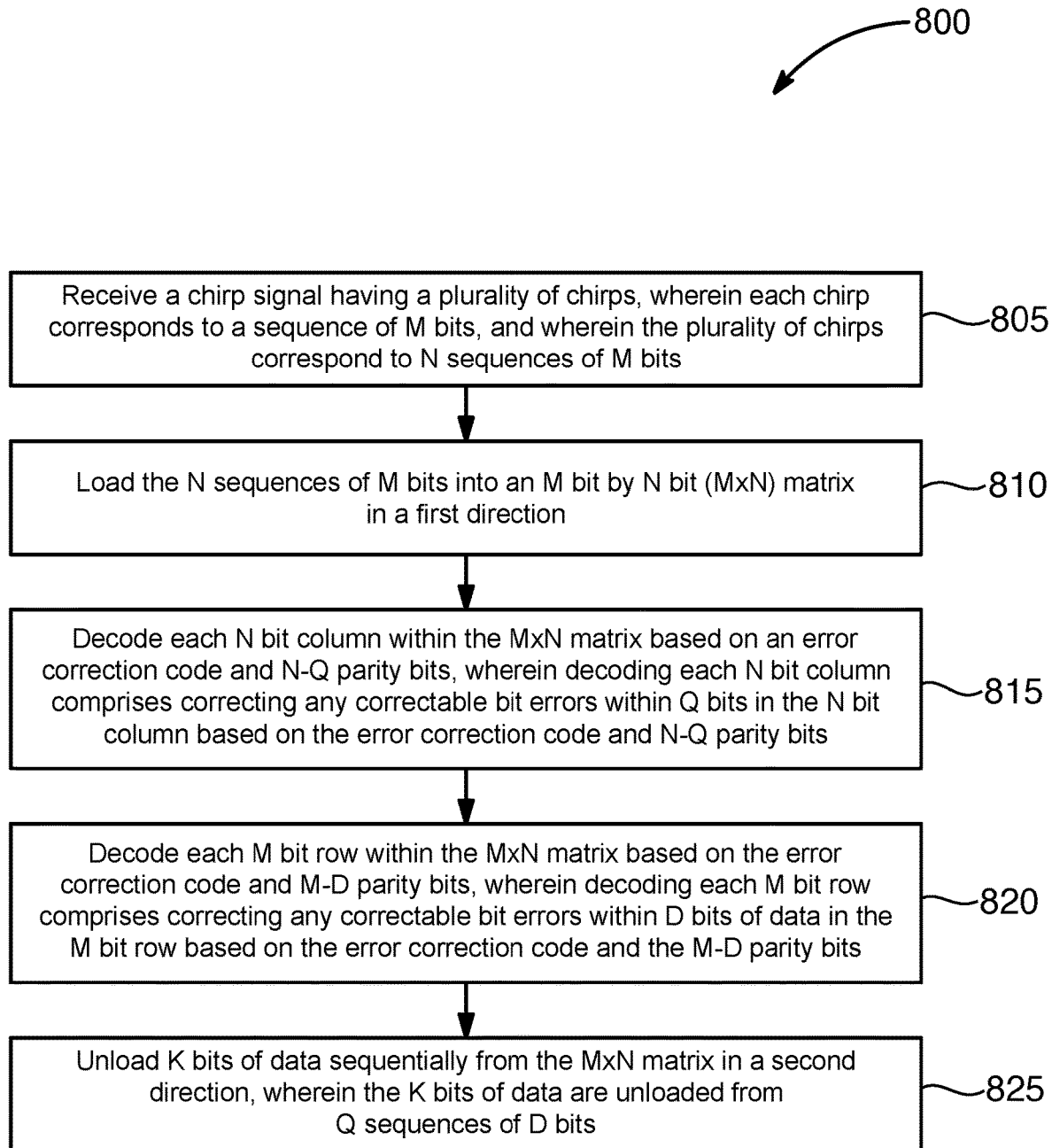
FIG. 8 is flow diagram illustrating one example of a method for error correction decoding with chirp spread spectrum.

FIG. 8 is flow diagram illustrating one example of a method 800 for error correction decoding with chirp spread spectrum. The method 800 may be implemented by a mobile device (e.g., mobile device 105) and more specifically by an application specific processor (e.g., processor 1110) included within the mobile device.

At 805, a chirp signal having a plurality of chirps is received, where each chirp corresponds to a sequence of M bits, and where the plurality of chirps correspond to N sequences of M bits. At 810, the N sequences of M bits are loaded into an M bit by N bit (M×N) matrix in a first direction. At 815, each N bit column within the M×N matrix is decoded based on an error correction code and N-Q parity bits, where decoding each N bit column comprises correcting an correctable bit errors with Q bit in the N bit column based on the error correction code and the N-Q parity bits. At 820, each M bit row within the M×N matrix is decoded based on the error correction code and M-D parity bits, where decoding each M bit row comprises correcting an correctable bit errors within D bits of data in the M bit row based on the error correction code and the M-D parity bits. At 825, K bits of data is unloaded sequentially from the M×N matrix in a second direction, wherein the K bits of data are unloaded from Q sequences of D bits.

Figure 9:
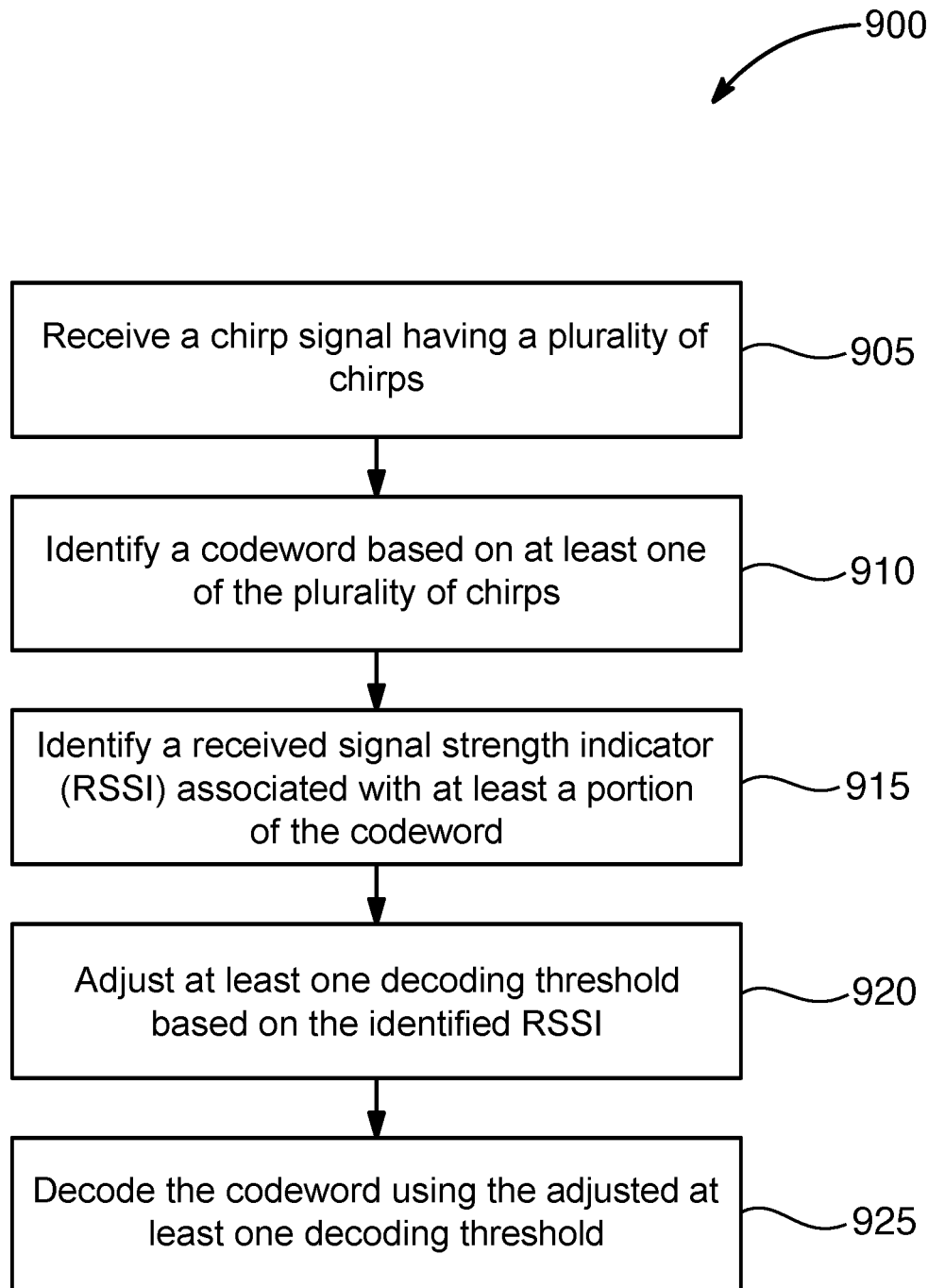
FIG. 9 is flow diagram illustrating one example of a method for error correction decoding with chirp spread spectrum.

FIG. 9 is flow diagram illustrating one example of a method 900 for error correction decoding with chirp spread spectrum. The method 900 may be implemented by a mobile device (e.g., mobile device 105) and more specifically by an application specific processor (e.g., processor 1110) included within the mobile device.

At 905, a chirp signal having a plurality of chirps is received. At 910, a codeword is identified based on a chirp of the plurality of chirps. At 915, a received signal strength indicator (RSSI) associated with at least a portion of the chirp is identified. At 920, at least one decoding threshold is adjusted based on the identified RSSI. At 925, the codeword is decoded using the adjusted at least one decoding threshold.

Figure 10:
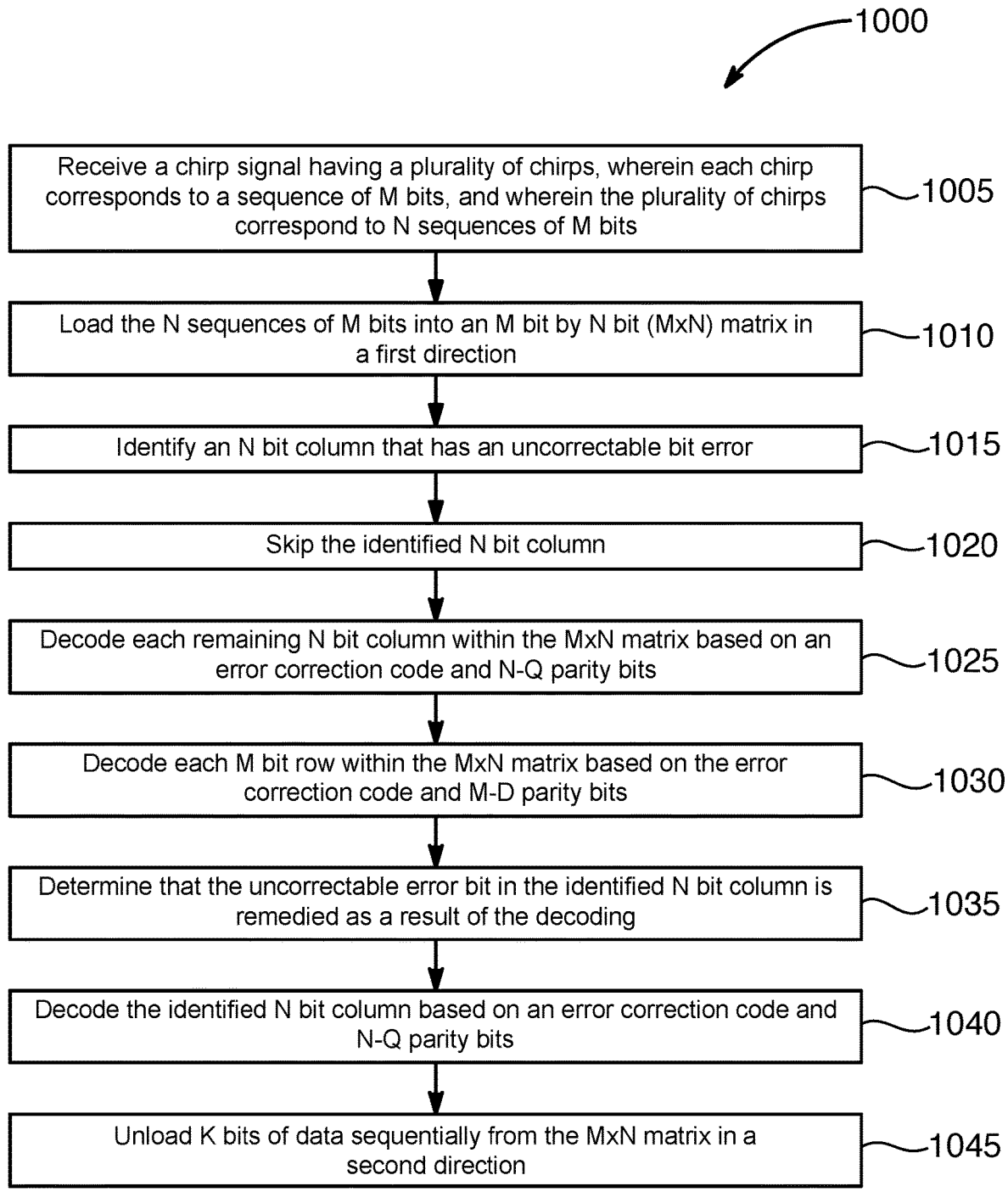
FIG. 10 is flow diagram illustrating one example of a method for error correction decoding with chirp spread spectrum.

FIG. 10 is flow diagram illustrating one example of a method 1000 for error correction decoding with chirp spread spectrum. The method 1000 may be implemented by a mobile device (e.g., mobile device 105) and more specifically by an application specific processor (e.g., processor 1110) included within the mobile device.

At 1005, a chirp signal having a plurality of chirps is received. Each chirp corresponds to a sequence of M bits, and the plurality of chirps corresponds to N sequences of M bits. At 1010, the N sequences of M bits are loaded into an M bit by N bit (M×N) matrix in a first direction. At 1015, an N bit column that has an uncorrectable bit error is identified. At 1020, the identified N bit column is skipped (from decoding, for example). At 1025, each remaining N bit column within the M×N matrix is decoded based on an error correction code and N-Q parity bits. At 1030, each M bit row within the M×N matrix is decoded based on the error correction code and M-D parity bits. At 1035, a determination is made that the uncorrectable error bit in the identified N bit column is remedied as a result of the decoding. At 1040, the identified N bit column is decoded based on the error correction code and N-Q parity bits. At 1045, K bits of data is unloaded sequentially from the M×N matrix in a second direction.

Figure 11:
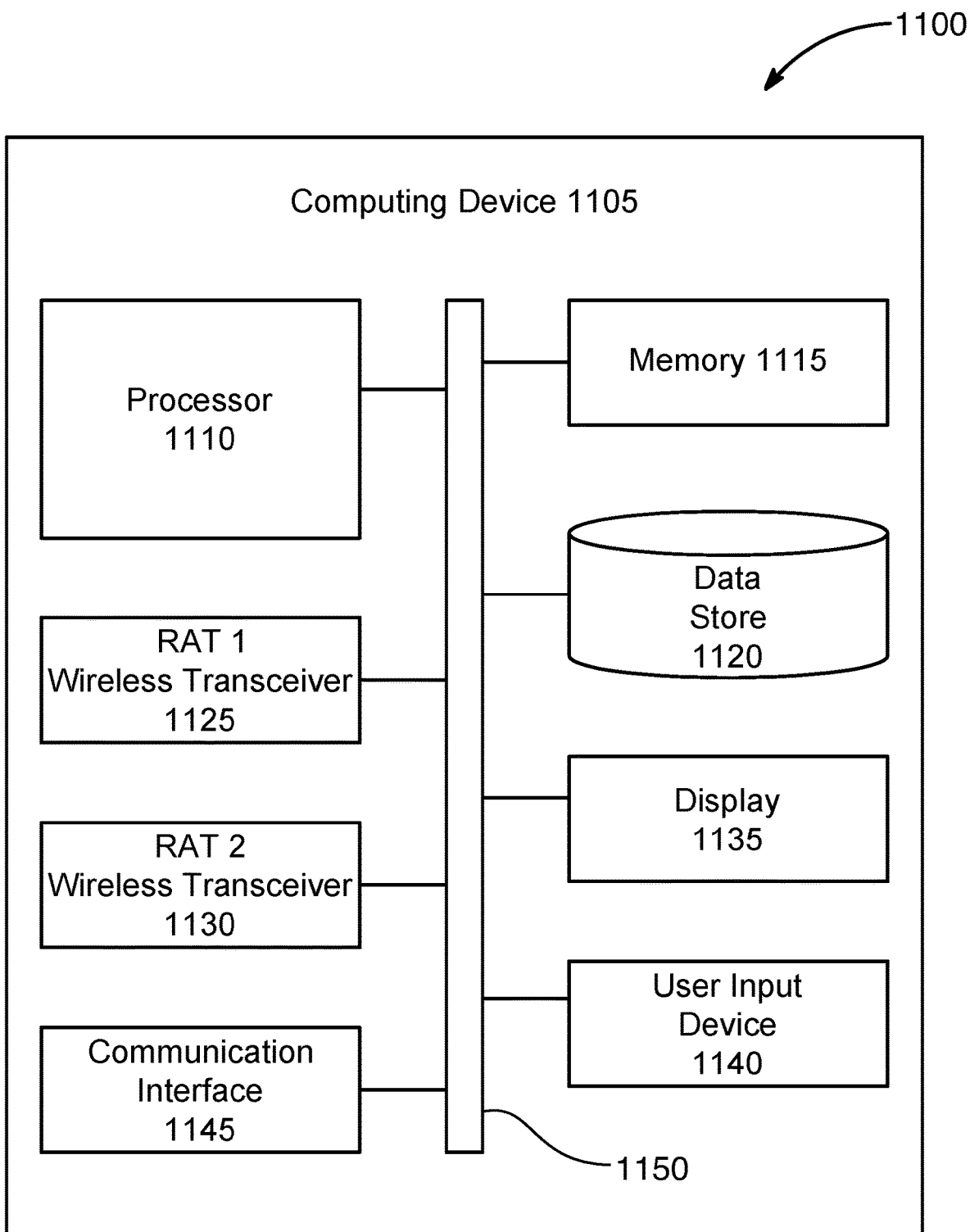
FIG. 11 is a block diagram of a computing device for implementing the described systems and methods.

FIG. 11 is a block diagram of a computing device 1105 for implementing the described systems and methods. In some embodiments, the mobile devices 105 (e.g., mobile device 105-a, 105-b) may be examples of the computing device 1105.

The computing device 1105 includes a processor 1110 (including a general-purpose processor and one or more application specific processors, for example), a wireless transceiver 1125 for communicating via a first RAT (e.g., 3G, 4G, LTE, 5G-NR, and/or LoRaWAN), an optional wireless transceiver 1130 for communicating via a second RAT (e.g., Bluetooth, Wi-Fi), a communication interface 1145 (e.g., serial interface, peripheral component interconnect express), a memory 1115 (e.g., random access memory (RAM), non-volatile RAM (NVRAM)), data store 1120 (e.g., hard disk drive, solid state disk), an optional display 1135 for interfacing with a user, a user input device 1140 (e.g., touch input, mouse, keyboard, pen input), and an interconnect or bus 1150 for interconnecting each of the components 1110-1140.

In some embodiments, the memory 1115 and/or the data store 1120 (each being a non-transitory storage medium, for example) may store instructions that are executable by the processor 1110 to implement the systems and methods described herein. For example, the instructions may be executable by the processor 1110 to implement any of the methods (e.g., method 700, method 800, method 900, and/or method 1000).

The invention has been described with reference to various specific and preferred embodiments and techniques. Nevertheless, it is understood that many variations and modifications may be made while remaining within the spirit and scope of the invention.

What is claimed is:

1. A method for error correction coding in wireless communication, comprising:

obtaining K bits of data;

loading the K bits of data sequentially into an M bit by N bit (M×N) matrix in a first direction as Q sequences of D bits;

coding each D bit row of data in the M×N matrix with an error correction code to generate an M bit row of coded data, wherein each M bit row of coded data corresponds to a first codeword having M-D bits of parity;

coding each Q bit column in the M×N matrix with the error correction code to generate N bits of coded data, wherein each N bit column corresponds to a second codeword, and wherein D of the N bit columns comprise coded data and M-D of the N bit columns comprise coded parity including N-Q parity on parity bits;

unloading N sequences of M bits sequentially from the M×N matrix in a second direction;

generating a chirp signal having a plurality of chirps; and transmitting the generated chirp signal.

2. The method of claim 1, wherein the error correction code comprises a turbo code.

3. The method of claim 2, wherein the turbo code comprises a Hamming code.

4. The method of claim 1, wherein the M×N matrix comprises a D bit by Q bit (D×Q) matrix of data with the remaining portion of the M×N matrix filled with parity bits, including a P bit by P bit (P×P) matrix of the parity on parity bits.

5. The method of claim 4, wherein the error correction code comprises a Hamming(31/26) code, where D is 26, Q is 26, P is 5, M is 31, and N is 31.

6. The method of claim 4, wherein the error correction code comprises an extended Hamming(31/26) code with an additional parity bit on the 31 bit sequence, where D is 26, Q is 26, P is 6, M is 32, and N is 32.

7. The method of claim 1, wherein the chirp signal is generated based on a chirp bandwidth and spreading factor.

8. The method of claim 1, wherein the first direction is by row and the second direction is by column.

9. The method of claim 1, wherein the first direction is by row and the second direction is diagonally.

10. A method for error correction decoding in wireless communication, comprising:
receiving a chirp signal having a plurality of chirps, wherein each chirp corresponds to a sequence of M bits, and wherein the plurality of chirps correspond to N sequences of M bits;
loading the N sequences of M bits into an M bit by N bit (M×N) matrix in a first direction, wherein the (M×N) matrix comprises P parity on parity bits, wherein each M bit row corresponds to a first codeword, and wherein each N bit column corresponds to a second codeword;
decoding each N bit column within the M×N matrix based on an error correction code and N-Q parity bits, wherein M-D of the N bit columns are parity columns and the N-Q parity bits are parity on parity bits, wherein decoding each N bit column comprises correcting any correctable bit errors within Q bits in the N bit column based on the error correction code and the N-Q parity bits;
decoding each M bit row within the M×N matrix based on the error correction code and M-D parity bits, wherein decoding each M bit row comprises correcting any correctable bit errors within D bits of data in the M bit row based on the error correction code and the M-D parity bits; and
unloading K bits of data sequentially from the M×N matrix in a second direction, wherein the K bits of data are unloaded from Q sequences of D bits.

11. The method of claim 10, wherein the error correction code comprises a turbo code.

12. The method of claim 11, wherein the turbo code comprises a Hamming code.

13. The method of claim 10, wherein coding each row of D bits in the M×N matrix with an error correction code forms D columns of the Q data bits and M-D columns of the Q parity bits.

14. The method of claim 10, wherein the M×N matrix comprises a D bit by Q bit (D×Q) matrix of data with the remaining portion of the M×N matrix filled with parity bits, including a P bit by P bit (P×P) matrix of the parity on parity bits.

15. The method of claim 14, wherein the error correction code comprises a Hamming(31/26) code, where D is 26, Q is 26, P is 5, M is 31, and N is 31.

16. The method of claim 14, wherein the error correction code comprises an extended Hamming(31/26) code with an additional parity bit on the 31 bit sequence, where D is 26, Q is 26, P is 6, M is 32, and N is 32.

17. The method of claim 10, wherein the chirp signal is received based on a chirp bandwidth and spreading factor.

18. The method of claim 10, further comprising demodulating the chirp signal to obtain the MN bits, wherein each M bit sequence is modulated as one of the plurality of chirps.

19. The method of claim 10, wherein the first direction is by column and the second direction is by row.

20. The method of claim 10, wherein the first direction is diagonally and the second direction is by row.

* * * * *